(12) United States Patent
Shitagaki et al.

(10) Patent No.: US 10,439,156 B2
(45) Date of Patent: Oct. 8, 2019

(54) LIGHT-EMITTING ELEMENT, LIGHT-EMITTING DEVICE, DISPLAY DEVICE, LIGHTING DEVICE, AND ELECTRONIC DEVICE

(71) Applicant: SEMICONDUCTOR ENERGY LABORATORY CO., LTD., Kanagawa-ken (JP)

(72) Inventors: Satoko Shitagaki, Isehara (JP); Takahiro Ishisone, Atsugi (JP); Satoshi Seo, Sagamihara (JP); Takeyoshi Watabe, Atsugi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/277,450

(22) Filed: May 14, 2014

(65) Prior Publication Data

US 2014/0339524 A1 Nov. 20, 2014

(30) Foreign Application Priority Data

May 17, 2013 (JP) .................................. 2013-104941

(51) Int. Cl.
*H01L 51/00* (2006.01)
*H01L 51/50* (2006.01)

(52) U.S. Cl.
CPC ...... *H01L 51/5028* (2013.01); *H01L 51/0072* (2013.01); *H01L 51/5048* (2013.01);
(Continued)

(58) Field of Classification Search
CPC ............. H01L 51/0052; H01L 51/0061; H01L 51/0067; H01L 51/0072; H01L 51/5012;
(Continued)

(56) References Cited

U.S. PATENT DOCUMENTS 6,893,744 B2 * 5/2005 Kim .................... H01L 51/0059
313/504
7,553,558 B2 6/2009 Klubek et al.
(Continued)

FOREIGN PATENT DOCUMENTS

CN 001762182 A 4/2006
CN 101461073 A 6/2009
(Continued)

*Primary Examiner* — Dale E Page
*Assistant Examiner* — Quovaunda V Jefferson
(74) *Attorney, Agent, or Firm* — Husch Blackwell LLP

(57) ABSTRACT

Provided is a light-emitting element which has an anode, a light-emitting layer over the anode, an electron-transport layer over and in contact with the light-emitting layer, an electron-injection layer over and in contact with the electron-transport layer, and a cathode over and in contact with the electron-injection layer. The light-emitting layer has an electron-transport property, and the electron-transport layer includes an anthracene derivative. The light-emitting layer further includes a phosphorescent substance. This device structure allows the formation of a highly efficient blue-emissive light-emitting element even though the phosphorescent substance has higher triplet energy than the anthracene derivative which directly contacts with the light-emitting layer.

22 Claims, 22 Drawing Sheets

(52) U.S. Cl.
CPC ...... *H01L 51/0052* (2013.01); *H01L 51/0067* (2013.01); *H01L 51/5072* (2013.01)

(58) Field of Classification Search
CPC ............. H01L 51/2028; H01L 51/5048; H01L 51/5072; H01L 51/5092
See application file for complete search history.

(56) References Cited

U.S. PATENT DOCUMENTS

| | | | |
|---|---|---|---|
| 7,649,211 | B2 | 1/2010 | Ohsawa |
| 7,733,009 | B2 | 6/2010 | Kondakov et al. |
| 8,076,676 | B2 | 12/2011 | Ohsawa |
| 8,410,492 | B2 | 4/2013 | Ohsawa |
| 8,860,019 | B2 | 10/2014 | Ohsawa |
| 8,986,857 | B2 | 3/2015 | Suzuki et al. |
| 9,118,020 | B2 | 8/2015 | Kondakova et al. |
| 9,240,558 | B2 | 1/2016 | Suzuki et al. |
| 9,634,256 | B2 | 4/2017 | Kondakova et al. |
| 9,666,826 | B2 | 5/2017 | Kondakov et al. |
| 2003/0129447 | A1* | 7/2003 | Madathil ............. H01L 51/5092 428/690 |
| 2004/0202893 | A1* | 10/2004 | Abe ...................... C09K 11/06 428/690 |
| 2005/0191519 | A1* | 9/2005 | Mishima ............... C09K 11/06 428/690 |
| 2006/0008670 | A1 | 1/2006 | Lin et al. |
| 2006/0110622 | A1 | 5/2006 | Uchida et al. |
| 2006/0180806 | A1 | 8/2006 | Arakane et al. |
| 2006/0257684 | A1 | 11/2006 | Arakane et al. |
| 2007/0122657 | A1 | 5/2007 | Klubek et al. |
| 2007/0182320 | A1* | 8/2007 | Nakamura ............. H01L 51/50 313/506 |
| 2007/0215867 | A1 | 9/2007 | Kawakami et al. |
| 2007/0252516 | A1 | 11/2007 | Kondakova et al. |
| 2007/0252521 | A1 | 11/2007 | Kondakov et al. |
| 2008/0006822 | A1 | 1/2008 | Ohsawa |
| 2008/0149923 | A1* | 6/2008 | Ohsawa et al. .................. 257/40 |
| 2008/0286445 | A1 | 11/2008 | Suzuki et al. |
| 2009/0015140 | A1 | 1/2009 | Kawakami et al. |
| 2009/0072732 | A1 | 3/2009 | Arakane et al. |
| 2009/0179552 | A1* | 7/2009 | Froehlich et al. ............ 313/504 |
| 2009/0286985 | A1 | 11/2009 | Kadoma et al. |
| 2011/0127510 | A1* | 6/2011 | Seo et al. ....................... 257/40 |
| 2011/0210316 | A1* | 9/2011 | Kadoma et al. ................ 257/40 |
| 2011/0215714 | A1* | 9/2011 | Seo et al. ..................... 313/504 |
| 2012/0104370 | A1* | 5/2012 | Suzuki et al. .................. 257/40 |
| 2012/0126723 | A1* | 5/2012 | Seo ............................... 315/312 |
| 2013/0020561 | A1* | 1/2013 | Suzuki et al. .................. 257/40 |

FOREIGN PATENT DOCUMENTS

| | | |
|---|---|---|
| CN | 103052624 A | 4/2013 |
| EP | 1 589 789 A1 | 10/2005 |
| EP | 2 011 178 | 1/2009 |
| EP | 2 013 314 | 1/2009 |
| JP | 2006-049570 A | 2/2006 |
| JP | 2008-204934 A | 9/2008 |
| JP | 2008-308685 A | 12/2008 |
| JP | 2009-035524 * | 2/2009 |
| JP | 2009-535812 | 10/2009 |
| JP | 2009-535815 | 10/2009 |
| JP | 2010-161410 A | 7/2010 |
| JP | 2011-216688 * | 10/2011 |
| JP | 2011-216688 A | 10/2011 |
| JP | 2013-047283 A | 3/2013 |
| KR | 2005-0098259 A | 10/2005 |
| KR | 2009-0005079 A | 1/2009 |
| KR | 2009-0007734 A | 1/2009 |
| KR | 2009-0029718 A | 2/2009 |
| KR | 2014-0015259 A | 2/2014 |
| WO | WO 2004/066685 A1 | 8/2004 |
| WO | WO 2006/046980 A1 | 5/2006 |
| WO | WO 2007/064484 A2 | 6/2007 |
| WO | WO 2007/064493 A1 | 6/2007 |
| WO | WO 2007/127063 A2 | 11/2007 |
| WO | WO 2007/127069 A1 | 11/2007 |
| WO | WO 2007/130263 A1 | 11/2007 |
| WO | WO 2007/139124 A1 | 12/2007 |
| WO | WO 2013/015144 A1 | 1/2013 |

* cited by examiner

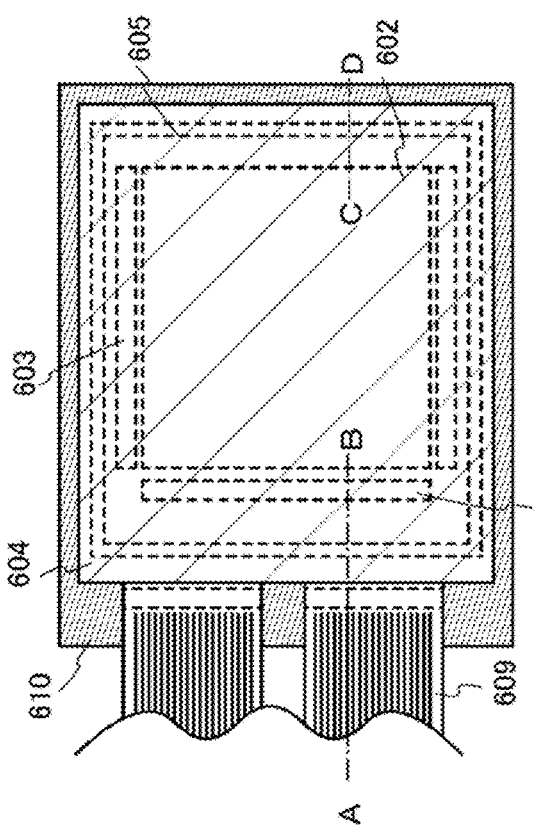
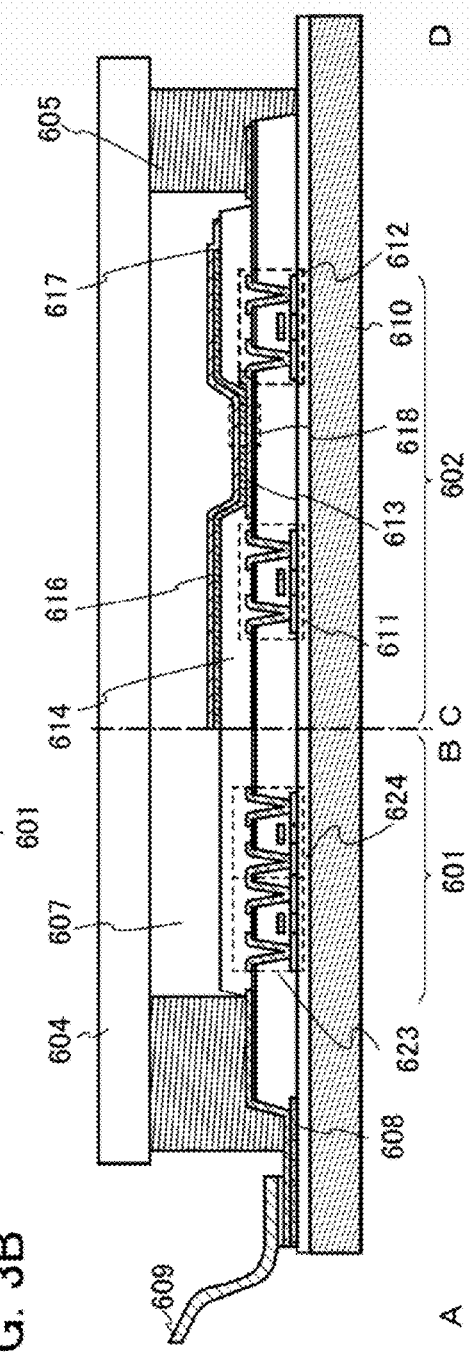
FIG. 3A
FIG. 3B

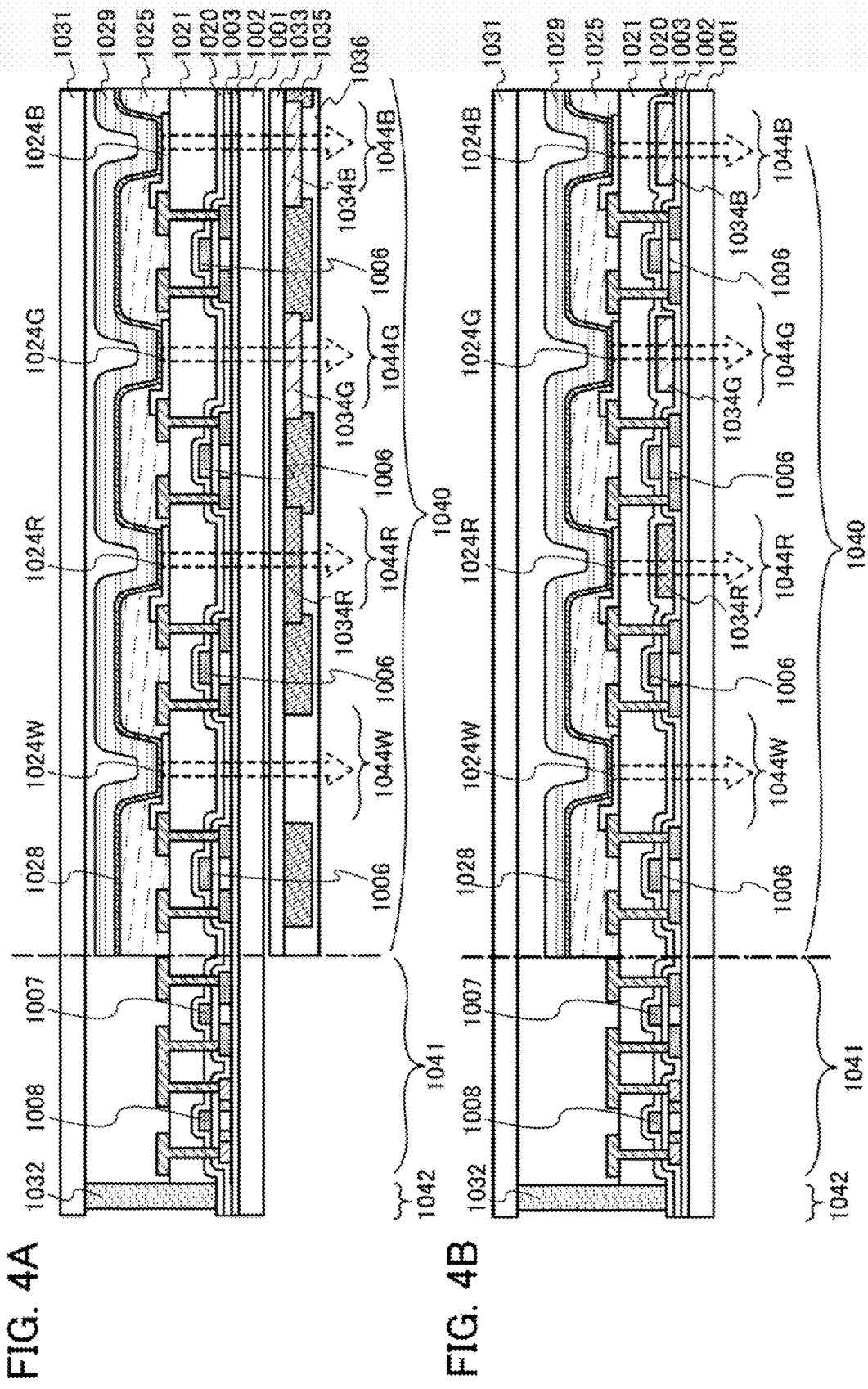

FIG. 7A
FIG. 7B
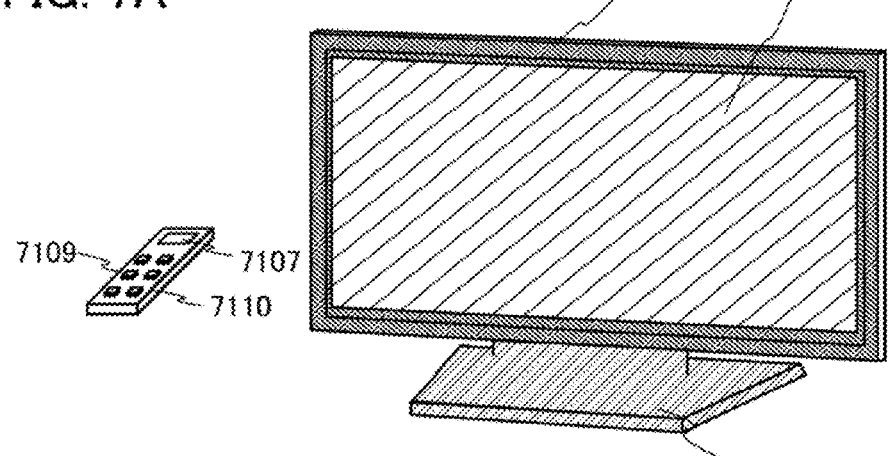
FIG. 7C
FIG. 7D
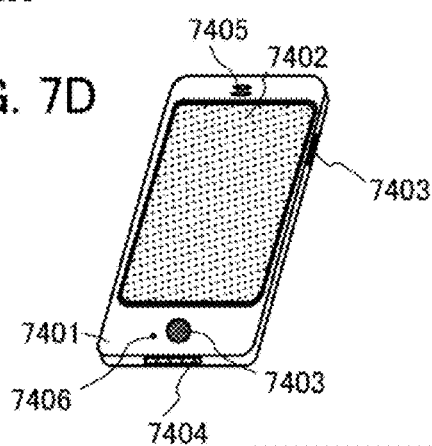

LIGHT-EMITTING ELEMENT, LIGHT-EMITTING DEVICE, DISPLAY DEVICE, LIGHTING DEVICE, AND ELECTRONIC DEVICE

BACKGROUND OF THE INVENTION

1. Field of the Invention

The present invention relates to a light-emitting element, a light-emitting device, a display device, a lighting device, and an electronic device.

2. Description of the Related Art

As next generation lighting devices or display devices, display devices using light-emitting elements (organic EL elements) in which organic compounds are used as light-emitting substances have been developed because of their advantages of thinness, lightweightness, high speed response to input signals, low power consumption, and the like.

In an organic EL element, voltage application between electrodes, between which a light-emitting layer is provided, causes recombination of electrons and holes injected from the electrodes, which brings a light-emitting substance into an excited state, and the return from the excited state to the ground state is accompanied by light emission. Since the wavelength of light emitted from a light-emitting substance depends on the light-emitting substance, use of different types of organic compounds as light-emitting substances makes it possible to obtain light-emitting elements which exhibit various wavelengths, i.e., various colors.

In the case of display devices which are used to display images, such as displays, at least three-color light, i.e., red light, green light, and blue light is necessary for reproduction of full-color images. Furthermore, in application to lighting devices, it is ideal to obtain light thoroughly covering the visible light region for obtaining a high color rendering property, and light obtained by mixing two or more kinds of light having different wavelengths is used for lighting application in many practical applications. It is known that, with a mixture of three-color light, i.e., red light, green light, and blue light, white light having a high color rendering property can be obtained.

The wavelength of light emitted from a light-emitting substance depends on the substance, as described above. However, important performances as a light-emitting element, such as a lifetime, power consumption, and emission efficiency, are not only dependent on a light-emitting substance but also greatly dependent on the materials in the layers other than a light-emitting layer, an element structure, and the like.

As is generally known, the generation ratio of a singlet excited state to a triplet excited state in a light-emitting element using electroluminescence is 1:3. Therefore, a light-emitting element in which a phosphorescent material capable of converting the triplet excited state to light emission is used as a light-emitting substance can theoretically obtain higher emission efficiency than a light-emitting element in which a fluorescent material capable of converting the singlet excited state to light emission is used as a light-emitting substance.

As a host material in a host-guest type light-emitting layer or a substance contained in each transport layer in contact with a light-emitting layer, a substance having a higher singlet excited state or a higher triplet excited state than a light-emitting substance is preferably used for efficient conversion of excitation energy to light emission from the light-emitting substance.

However, most substances that are used as a host material of the light-emitting element are fluorescent materials, in which transition between the states with different spin multiplicities is forbidden. The triplet excited state is normally at a lower energy level than the singlet excited state having the same excited level, which means that a host material for obtaining phosphorescence needs to have a higher singlet excited state than a host material for obtaining fluorescence of the same wavelength.

Therefore, a host material and a carrier-transport material each having a further wider band gap are necessary in order to efficiently obtain phosphorescence of a shorter wavelength. A light-emitting element that includes such a material and emits phosphorescence of a short wavelength (e.g., blue phosphorescence) has a high deterioration rate and thus experiences difficulty in actual use. Against this backdrop, lifetime extension of a phosphorescent light-emitting element by devising an element structure has been under study (for example, see Patent Document 1).

REFERENCE

Patent Document

[Patent Document 1] Japanese Published Patent Application No. 2006-049570

SUMMARY OF THE INVENTION

In Patent Document 1, a hole-blocking layer is used and thus, holes are accumulated on a cathode side of a light-emitting layer. Accordingly, a light-emitting region is locally formed on the cathode side of the light-emitting layer. Because an anthracene derivative used in the hole-blocking layer has a low triplet excitation level, energy is easily transferred from a light-emitting material, leading to a reduction in emission efficiency. In addition, local accumulation of carriers at an interface is not preferable from the viewpoint of preventing deterioration of a light-emitting element.

In view of the above, one object of one embodiment of the present invention is to provide a light-emitting element that has high emission efficiency and suffers less deterioration. One object of one embodiment of the present invention is to provide a phosphorescent light-emitting element that has high emission efficiency and suffers less deterioration. One object of one embodiment of the present invention is to provide a light-emitting element that has high emission efficiency, suffers less deterioration, and emits green to blue phosphorescence. One object of one embodiment of the present invention is to particularly provide a light-emitting element that has a smaller drive voltage increase.

One object of one embodiment of the present invention is to provide a display module, a lighting module, a light-emitting device, a lighting device, a display device, and an electronic device each using the light-emitting element and achieving low power consumption.

It is only necessary that at least one of the above-described objects be achieved in the present invention.

Any of the above objects is achieved by the use of a substance with an anthracene skeleton in an electron-transport layer that is in contact with a light-emitting layer in a light-emitting element emitting phosphorescence of a short wavelength.

That is, one embodiment of the present invention is a light-emitting element that includes an anode, a cathode, and an EL layer between the anode and the cathode. The EL layer includes a light-emitting layer; an electron-transport layer in contact with the cathode side of the light-emitting layer; and an electron-injection layer in contact with the electron-transport layer and the cathode. The light-emitting layer contains a phosphorescent substance and a host material. The light-emitting layer has an electron-transport property higher than a hole-transport property. The electron-transport layer contains a substance with an anthracene skeleton. The electron-injection layer contains an organic compound.

One embodiment of the present invention is a light-emitting element with the above structure in which the phosphorescent substance emits phosphorescence with a peak in a range from 420 nm to 530 nm.

One embodiment of the present invention is a light-emitting element with any one of the above structures in which the substance with an anthracene skeleton has a carbazole skeleton.

One embodiment of the present invention is a light-emitting element with any one of the above structures in which the host material contains a substance with a heteroaromatic ring.

One embodiment of the present invention is a light-emitting element with the above structure in which the substance with a heteroaromatic ring is a π-electron deficient heteroaromatic compound.

One embodiment of the present invention is a light-emitting element with any one of the above structures in which the host material contains a substance with any one of a pyridine skeleton and a pyrimidine skeleton.

One embodiment of the present invention is a light-emitting element with any one of the above structures in which the substance with an anthracene skeleton is any one of 9-[4-(10-phenyl-9-anthryl)phenyl]-9H-carbazole and 7-[4-(10-phenyl-9-anthryl)phenyl]-7H-dibenzo[c,g]carbazole.

One embodiment of the present invention is a light-emitting element with any one of the above structures in which the organic compound contained in the electron-injection layer is bathophenanthroline.

One embodiment of the present invention is a lighting device that includes a light-emitting element having any one of the above structures.

One embodiment of the present invention is a light-emitting device that includes a light-emitting element having any one of the above structures and a unit for controlling the light-emitting element.

One embodiment of the present invention is a display device that includes a light-emitting element having any one of the above structures in a display portion and a unit for controlling the light-emitting element.

One embodiment of the present invention is an electronic device that includes a light-emitting element having any one of the above structures.

A light-emitting element of the present invention has high emission efficiency and suffers less deterioration. A light-emitting element of the present invention is a phosphorescent light-emitting element that has high emission efficiency and suffers less deterioration. A light-emitting element of the present invention has high emission efficiency, suffers less deterioration, and emits green to blue phosphorescence. A light-emitting element of the present invention has a smaller drive voltage increase.

In one embodiment of the present invention, a display module, a lighting module, a light-emitting device, a lighting device, a display device, and an electronic device each using the light-emitting element, achieving low power consumption, and having high reliability can be provided.

BRIEF DESCRIPTION OF THE DRAWINGS

FIGS. 3A and 3B are schematic diagrams of an active matrix light-emitting device.

FIGS. 4A and 4B are schematic diagrams of active matrix light-emitting devices.

FIGS. 7A to 7D illustrate electronic devices.

DETAILED DESCRIPTION OF THE INVENTION

Hereinafter, embodiments of the present invention will be described. The present invention can be implemented in various modes, and it is easily understood by those skilled in the art that modes and details disclosed herein can be modified in various ways without departing from the spirit and the scope of the present invention. Therefore, the present invention is not construed as being limited to description of the embodiments.

Embodiment 1

Figure 1A:
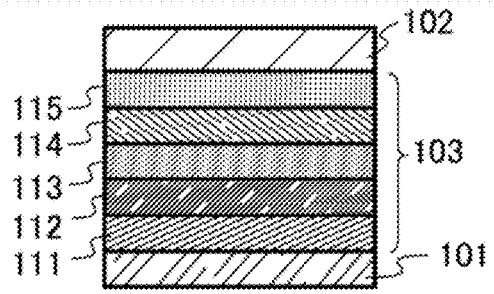
FIGS. 1A and 1B are schematic diagrams of a light-emitting element.

FIG. 1A is a schematic diagram of a light-emitting element in this embodiment.

The light-emitting element includes an anode 101, a cathode 102, and an EL layer 103 provided therebetween. The EL layer 103 includes at least a light-emitting layer 113, an electron-transport layer 114, and an electron-injection layer 115. The light-emitting layer 113 and the electron-transport layer 114 are in contact with each other; the electron-transport layer 114 and the electron-injection layer 115 are in contact with each other; and the electron-injection layer 115 and the cathode 102 are in contact with each other. That is, the light-emitting layer 113, the electron-transport layer 114, the electron-injection layer 115, and the cathode 102 are formed in that order so that adjacent layers are in contact with each other.

The light-emitting layer 113 contains at least a phosphorescent substance and a host material for dispersing the phosphorescent substance. The phosphorescent substance preferably emits phosphorescence of a relatively short wavelength (typically 420 nm to 530 am).

The electron-transport layer 114 contains a substance with an anthracene skeleton.

In the light-emitting element of this embodiment that has the above structure, a deterioration rate is low, and specifically, an increase in voltage due to driving is small. In a light-emitting element that does not have the above structure and emits phosphorescence of a short wavelength, when a driving is performed with a constant current density, voltage seriously increases over driving time. This means that voltage required to make a constant current flow rises and that driving of the light-emitting element increases the resistance therein. Accordingly, the light-emitting element in this embodiment can be regarded as a light-emitting element in which an increase in internal resistance due to driving is small.

The host material contained in the light-emitting layer 113 is preferably a material that has higher triplet excitation energy (an energy difference between a singlet ground state and a triplet excited state) than the phosphorescent substance. A preferable example of such a material is a substance with a heteroaromatic ring. Note that the amount of the host material is higher than that of any other component in the light-emitting layer 113.

The substance with an anthracene skeleton has lower triplet excitation energy than the above phosphorescent substance; therefore, a carrier recombination region in the light-emitting layer 113 preferably exists apart from the interface with the electron-transport layer 114. It is thus preferable that an electron-transport property be higher than a hole-transport property at least in a region on the electron-transport layer 114 side of the light-emitting layer 113. To provide this structure, a substance that has an electron-transport property higher than a hole-transport property is preferably used as the host material. Examples of a substance that has an electron-transport property higher than a hole-transport property include a π-electron deficient heteroaromatic compound.

As an example of a π-electron deficient heteroaromatic compound that allows the effect of preventing the above deterioration (drive voltage increase) to be more efficiently achieved, a substance with a pyridine skeleton or a pyrimidine skeleton can be given. Because of its electron-transport property, in general, the substance can also be used for the electron-transport layer 114. In view of fabrication steps and electron injection into the light-emitting layer 113, a structure is usually considered advantageous in which the host material is the same as a material included in the electron-transport layer 114. However, as compared to a light-emitting element with such a structure in which the host material is the same as an organic compound contained in the electron-transport layer 114, the light-emitting element in this embodiment in which the electron-transport layer contains the substance with an anthracene skeleton suffers less deterioration (has a smaller drive voltage increase and a smaller luminance reduction).

In general, design is often performed such that the LUMO level of the host material is shallower than that of the material of the electron-transport layer 114 and that the LUMO level of the material of the electron-transport layer 114 is shallower than that of the material of the electron-injection layer 115 in order that electron injection from the cathode 102 to the light-emitting layer 113 can be smoothly performed to prevent deterioration due to a high electron-injection barrier and to reduce drive voltage. However, the light-emitting element in this embodiment has a major characteristic in that deterioration can be prevented even when the substance with an anthracene skeleton used in the electron-transport layer 114 has the deepest LUMO level. It is needless to say that deterioration can be prevented also when the substance with an anthracene skeleton has a LUMO level substantially equal to that of the host material or the material of the electron-injection layer 115 or when the substance with an anthracene skeleton has a LUMO level between those of the material of the electron-injection layer 115 and the host material as described above.

It is preferable that the substance with an anthracene skeleton that is contained in the electron-transport layer 114 further have a carbazole skeleton in a molecule.

Among substances that have an anthracene skeleton and a carbazole skeleton, 9-[4-(10-phenyl-9-anthryl)phenyl]-9H-carbazole (abbreviation: CzPA) and 7-[4-(10-phenyl-9-anthryl)phenyl]-7H-dibenzo[c,g]carbazole (abbreviation: cgDBCzPA) are particularly preferable because they provide favorable element characteristics.

The electron-injection layer 115 contains an organic compound. An electron-transport material can be used as the organic compound. In view of drive voltage, the LUMO level of the organic compound contained in the electron-injection layer 115 is preferably deeper than that of the substance used as the host material. Note that, in this embodiment, an aromatic hydrocarbon which does not have a heteroaromatic ring is not used as a main material of the electron-injection layer 115 because the function as a light-emitting element cannot be obtained. It is preferred that the organic compound used for the electron-injection layer 115 readily accept electrons from the cathode and form a negligibly small electron-injection barrier to the electron-transport layer 114 including the substance having an anthracene skeleton. In order that the organic compound used for the electron-injection layer 115 can easily accept electrons from the cathode, the organic compound is preferably a π-electron deficient heteroaromatic compound, examples of which include a heteroaromatic compound having any of a pyridine skeleton, a bipyridine skeleton, a phthalazine skeleton, a pyrimidine skeleton, a pyrazine skeleton, a quinoline skeleton, a quinoxaline skeleton, a dibenzo[f,h]quinoxaline skeleton, and a triazine skeleton. Among them, the bipyridine skeleton is particularly effective. As a heteroaromatic compound including the bipyridine skeleton, a 2,2'-bipyridine compound and a phenanthroline compound which is a derivative of the 2,2'-bipyridine compound are preferable. Further, to lower an electron-injection barrier to the electron-transport layer 114, it is preferable that the LUMO level of the organic compound used for the electron-injection layer 115 be substantially equal to or shallower than that of the substance with an anthracene skeleton used for the electron-transport layer 114. Note that the LUMO level of the organic compound in the electron-injection layer 115 is preferably deeper than that in the host material, as already described.

The use of the above-described structure of the light-emitting element in this embodiment makes it possible to provide a highly reliable light-emitting element which, in spite of emitting phosphorescence of a short wavelength, suffers less deterioration and specifically, has a smaller drive voltage increase.

Next, the structure of the light-emitting element in this embodiment will be described in detail with reference to FIGS. 1A and 1B.

A light-emitting element in this embodiment has a plurality of layers between a pair of electrodes. In this embodiment, the light-emitting element includes the anode 101, the cathode 102, and the EL layer 103, which is provided between the anode 101 and the cathode 102. Although the anode 101 is provided in a lower position and the cathode 102 is provided in an upper position in FIG. 1A, they may be provided upside down. Note that in the light-emitting element of this embodiment, at least the light-emitting layer 113, the electron-transport layer 114, and the electron-injection layer 115 are stacked.

For the anode, any of metals, alloys, electrically conductive compounds, and mixtures thereof which have a high work function (specifically, a work function of 4.0 eV or more) or the like is preferably used. Specific examples are indium oxide-tin oxide (ITO: indium tin oxide), indium oxide-tin oxide containing silicon or silicon oxide, indium oxide-zinc oxide, indium oxide containing tungsten oxide and zinc oxide (IWZO), and the like. Films of these electrically conductive metal oxides are usually formed by sputtering but may be formed by a sol-gel method or the like. For example, indium oxide-zinc oxide can be formed by a sputtering method using a target in which zinc oxide is added to indium oxide at 1 wt % to 20 wt %. Moreover, indium oxide containing tungsten oxide and zinc oxide (IWZO) can be formed by a sputtering method using a target in which tungsten oxide is added to indium oxide at 0.5 wt % to 5 wt % and zinc oxide is added to indium oxide at 0.1 wt % to 1 wt %. Other examples are gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), and the like. Graphene may also be used.

There is no particular limitation on the stacked structure of the EL layer 103 as long as a stack including the light-emitting layer 113, the electron-transport layer 114, and the electron-injection layer 115 is formed. The EL layer 103 can be formed by combining a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), a layer having a carrier-blocking property, and the like as appropriate. In this embodiment, the EL layer 103 has a structure in which a hole-injection layer ill, a hole-transport layer 112, a light-emitting layer 113, an electron-transport layer 114, and an electron-injection layer 115 are stacked in this order over the anode. Materials contained in the layers are specifically given below.

The hole-injection layer 111 is a layer containing a substance having a hole-injection property. The hole-injection layer 111 can be formed using molybdenum oxide, vanadium oxide, ruthenium oxide, tungsten oxide, manganese oxide, or the like. The hole-injection layer 111 can also be formed using a phthalocyanine-based compound such as phthalocyanine (abbreviation: $H_2Pc$) or copper phthalocyanine (abbreviation: CuPc); an aromatic amine compound such as 4,4'-bis[N-(4-diphenylaminophenyl)-N-phenylamino]biphenyl (abbreviation: DPAB) or N,N'-bis{4-[bis (3-methylphenyl)amino]phenyl}-N,N'-diphenyl-(1,1'-biphenyl)-4,4'-diamine (abbreviation: DNTPD); a high molecular-weight compound such as poly(3,4-ethylenedioxythiophene)/poly(styrenesulfonic acid) (PEDOT/PSS); or the like.

The hole-injection layer 111 can be formed using a composite material in which a substance exhibiting an electron-accepting property (hereinafter, simply referred to as "electron-accepting substance") with respect to a substance having a hole-transport property is contained in the substance having a hole-transport property. In this specification, a composite material refers to not a material in which two materials are simply mixed but a material in the state where charge transfer between the materials can be caused by a mixture of a plurality of materials. This charge transfer includes the charge transfer that occurs only when an electric field exists.

Note that by using the composite material in which the electron-accepting substance is contained in the substance having a hole-transport property, a material used for forming the electrode can be selected regardless of the work function of the material. In other words, besides a material having a high work function, a material having a low work function can be used for the anode. Examples of the electron-accepting substance are 7,7,8,8-tetracyano-2,3,5,6-tetrafluoroquinodimethane (abbreviation: $F_4$-TCNQ), chloranil, and the like. In particular, an oxide of a metal belonging to any of Groups 4 to 8 of the periodic table can be suitably used. Specifically, vanadium oxide, niobium oxide, tantalum oxide, chromium oxide, molybdenum oxide, tungsten oxide, manganese oxide, and rhenium oxide are preferable because of their high electron-accepting properties. Among these oxides, molybdenum oxide is especially preferable as the electron-accepting substance because it is stable in the air, has a low hygroscopic property, and is easily handled.

As the substance with a hole-transport property used for the composite material, a variety of organic compounds such as an aromatic amine compound, a carbazole compound, an aromatic hydrocarbon, and a high molecular-weight compound (such as an oligomer, a dendrimer, or a polymer) can be used. The organic compound used for the composite material is preferably an organic compound having a high hole-transport property. Specifically, a substance having a hole mobility of $1\times10^{-6}$ cm$^2$/Vs or higher is preferably used. Note that any other substance may be used as long as the substance has a hole-transport property higher than an electron-transport property. Specific examples of the organic compound that can be used as a substance having a hole-transport property in the composite material are given below.

Examples of the aromatic amine compound are N,N'-di (p-tolyl)-N,N'-diphenyl-p-phenylenediamine (abbreviation: DTDPPA), DPAB, DNTPD, 1,3,5-tris[N-(4-diphenylaminophenyl)-N-phenylamino]benzene (abbreviation: DPA3B), and the like.

Specific examples of the carbazole compound that can be used for the composite material are 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole compound that can be used for the composite material are 4,4'-di(N-carbazolyl)biphenyl (abbreviation: CBP), 1,3,5-tris[4-(N-carbazolyl)phenyl]benzene (abbreviation: TCPB), CzPA, 1,4-bis[4-(N-carbazolyl)phenyl]-2,3,5,6-tetraphenylbenzene, and the like.

Examples of the aromatic hydrocarbon that can be used for the composite material are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Other examples are pentacene, coronene, and the like. The aromatic hydrocarbon having a hole mobility of $1\times10^{-6}$ cm$^2$/Vs or more and having 14 to 42 carbon atoms is particularly preferable.

The aromatic hydrocarbon that can be used for the composite material may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Other examples are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: poly-TPD).

The hole-transport layer 112 is a layer containing a substance having a hole-transport property. As the substance having a hole-transport property, the substances that can be used for the above composite material and have hole-transport properties can be used. Note that detailed description is omitted to avoid repetition. Refer to the description of the composite material.

The light-emitting layer 113 is a layer containing a light-emitting substance. The light-emitting layer 113 is formed using a phosphorescent substance and a host material.

A phosphorescent substance with an emission peak in a range from 420 nm to 530 nm, is preferably used in the light-emitting layer 113. As examples of the phosphorescent substance, the following blue-emissive phosphorescent substances can be given: an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC'}iridium(III) (abbreviation: [Ir(mpptz-dmp)$_3$]), tris(5-methyl-3,4-diphenyl-4H-1,2,4-triazolato)iridium(II) (abbreviation: [Ir(Mptz)$_3$]), or tris[4-(3-biphenyl)-5-isopropyl-3-phenyl-4H-1,2,4-triazolato]iridium(III) (abbreviation: [Ir(iPrptz-3b)$_3$]); an organometallic iridium complex having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) or tris(1-methyl-5-phenyl-3-propyl-1H-1,2,4-triazolato)iridium(III) (abbreviation: [Ir(Prptz1-Me)$_3$]); an organometallic iridium complex having an imidazole skeleton, such as fac-tris[1-(2,6-diisopropylphenyl)-2-phenyl-1H-imidazole]iridium(III) (abbreviation: [Ir(iPrpmi)$_3$]) or tris[3-(2,6-dimethylphenyl)-7-methylimidazo[1,2-f]phenanthridinato]iridium(III) (abbreviation: Ir(dmpimpt-Me)$_3$); and an organometallic iridium complex in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(II) picolinate (abbreviation: FIrpic), bis{2-[3',5'-bis(trifluoromethyl)phenyl]pyridinato-N,C$^{2'}$}iridium(III) picolinate (abbreviation: [Ir(CF$_3$ppy)$_2$(pic)]), or bis[2-(4',6'-difluorophenyl)pyridinato-N,C$^{2'}$]iridium(III) acetylacetonate (abbreviation: FIr(acac)). Note that an organometallic iridium complex having a 4H-triazole skeleton has excellent reliability and emission efficiency and thus is especially preferable. Further examples include the following green-emissive phosphorescent substances: an organometallic iridium complex having a pyrimidine skeleton, such as tris(4-methyl-6-phenylpyrimidinato)iridium (III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), bis[2-(6-tert-butyl-4-pyrimidinyl-κN3)phenyl-κC](2,4-pentanedionato-κ$^2$O,O')iridium(III) (abbreviation: [Ir(tBuppm)$_2$(acac)]), (acetylacetonato)bis[4-(2-norbornyl)-6-phenylpyrimidinato]iridium(III) (endo- and exo-mixture) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), or (acetylacetonato) bis(4,6-diphenylpyrimidinato)iridium(III) (abbreviation: [Ir(dppm)$_2$(acac)]); an organometallic iridium complex having a pyrazine skeleton, such as (acetylacetonato)bis(3,5-dimethyl-2-phenylpyrazinato)iridium(III) (abbreviation: (Ir(mppr-Me)$_2$(acac))) or (acetylacetonato)bis(5-isopropyl-3-methyl-2-phenylpyrazinato)iridium(III) (abbreviation: [Ir(mppr-iPr)$_2$(acac)]); an organometallic iridium complex having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), or bis(2-phenylquinolinato-N,C$^{2'}$)iridium(III) acetylacetonate (abbreviation: [Ir(pq)$_2$(acac)]); and a rare earth metal complex such as tris(acetylacetonato)(monophenanthroline)terbium(III) (abbreviation: Tb(acac)$_3$(Phen)).

Instead of the above substances, a known phosphorescent substance that has an emission peak in a range from 420 nm to 530 nm may be used.

As the host material in which the above light-emitting substance is dispersed, a known material can be used but it is preferable to select a substance having a higher triplet level than the light-emitting substance. The light-emitting layer may contain a third substance in addition to the host material and the phosphorescent substance. Note that this statement does not exclude the possibility that the light-emitting layer contains a component other than the host material, the phosphorescent substance, and the third substance.

Because the light-emitting element in this embodiment includes the substance with an anthracene skeleton that has low triplet excitation energy in the electron-transport layer 114, a carrier recombination region preferably exists apart from the electron-transport layer 114. Accordingly, a material that has an electron-transport property higher than a hole-transport property is preferably used as the host material.

As the material, an electron-transport material having an electron mobility of 10$^{-6}$ cm$^2$/Vs or higher can be used mainly. Specifically, a π-electron deficient heteroaromatic compound such as a nitrogen-containing heteroaromatic compound is preferable, and for example, the following compounds can be used: heterocyclic compounds having polyazole skeletons, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having quinoxaline skeletons or dibenzoquinoxaline skeletons, such as 2-[3-(dibenzothiophen-4-yl)phenyl]dibenzo[f,h]quinoxaline (abbreviation: 2mDBTPDBq-II), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 2-[3-(dibenzothiophen-4-yl)biphenyl-3-yl]dibenzo[f,h]quinoxaline (abbreviation: 2mDBTBPDBq-II), and 2-[3'-(9H-carbazol-9-yl)biphenyl-3-yl]dibenzo[f,h]quinoxaline (abbreviation: 2mCzBPDBq); heterocyclic compounds having diazine skeletons (pyrimidine skeletons or pyrazine skeletons), such as 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl pyrimidine (abbreviation: 4,6mCzP2Pm), and 4-3'-(dibenzothiophen-4-yl)biphenyl-3-yl]benzofuro[3,2-d]pyrimidine (abbreviation: 4mDBTBPBfpm-II); and heterocyclic compounds having pyridine skeletons, such as 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), and 3,3',5,5'-tetra[(m-pyridyl)-phen-3-yl]biphenyl (abbreviation: BP4mPy). Among the above-described compounds, the heterocyclic compounds having quinoxaline skeletons or dibenzoquinoxaline skeletons, the heterocyclic compounds having diazine skeletons, and the heterocyclic compounds having pyridine skeletons have high reliability and can be preferably used. The following can also be given: triarylphosphine oxides such as phenyl-di(1-pyrenyl)phosphine oxide (abbreviation: POPy$_2$), spiro-9,9'-bifluoren-2-yl-diphenylphosphine oxide (abbreviation: SPPO1), 2,8-bis(diphenylphosphoryl)dibenzo[b,d]thiophene (abbreviation: PPT), and 3-(diphenylphosphoryl)-9-[4-(diphenylphosphoryl)phenyl]-9H-carbazole (abbreviation: PPO21); and triarylborane such as tris[2,4,6-trimethyl-3-(3-pyridyl)phenyl]borane (abbreviation: 3TPYMB). Specifically, the heterocyclic compounds having diazine (pyrimidine or pyrazine) skeletons are preferable because they have a high electron-transport property to contribute to a reduction in drive voltage, and exhibit a distinct effect of preventing a drive voltage increase. As the host material, a compound having a pyridine group, a 2,2'-bipyridine group, or a pyrimidine group to which one or two carbazolyl groups (e.g., N-carbazolyl group) are bonded through a phenylene group or a biphenylene group is preferred.

When the third substance is used, the host material and the third substance may be an electron-transport compound and a hole-transport compound, respectively. In that case, carrier balance can be controlled by adjusting the mixture ratio thereof. Note that in that case, the following structure may be employed: a light-emitting layer in which one kind of a light-emitting substance is dispersed is divided into two layers, and the two layers have different mixture ratios of the host material to the third substance. With this structure, the carrier balance of the light-emitting element can be optimized, so that the lifetime of the light-emitting element can be improved. For example, the layer closer to the electron-transport layer may have an electron-transport property and the layer closer to the hole-transport layer may have a hole-transport property.

The following are examples of a material that has a hole-transport property: a compound having an aromatic amine skeleton such as NPB, TPD, 4,4'-bis[N-(spiro-9,9'-bifluoren-2-yl)-N-phenylamino]biphenyl (abbreviation: BSPB), 4-phenyl-4'-(9-phenyl fluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbarol-3-yl)triphenylamine (abbreviation: PCBNBB), 9,9- dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton such as 1,3-bis(N-carbazolyl)benzene (abbreviation: mCP), CBP, 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4"-(benzene-1,3,5-triyl)tri(dibenzothiopbene) (abbreviation: DBT3P-II), 2,8-diphenyl-4-(49-phenyl-9H-fluoren-9-yl)phenyl dibenzothiophene (abbreviation: DBTFLP-III), or 4-[4-(9-phenyl-9H-fluoren-9-yl)phenyl]-6-phenyldibenzothiophene (abbreviation: DBTFLP-IV): and a compound having a furan skeleton such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, a compound having an aromatic amine skeleton and a compound having a carbazole skeleton are preferable because these compounds are highly reliable.

The light-emitting layer 113 may be either a single-layer light-emitting layer or a multi-layer light-emitting layer in which a plurality of layers are stacked. When the light-emitting layer is a multi-layer light-emitting layer, at least the layer in contact with the electron-transport layer 114 has the above-described structure.

The light-emitting layer can be formed using co-evaporation or an inkjet method, a spin coating method, a dip coating method, or the like. Note that co-evaporation is an evaporation method in which a plurality of different substances are concurrently vaporized from respective different evaporation sources.

The electron-transport layer 114 contains the substance with an anthracene skeleton. As the substance, it is possible to use CzPA, cgDBCzPA, 4-[3-(9,10-diphenyl-2-anthryl)phenyl]dibenzofuran (abbreviation: 2mDBFPPA-II), 6-[3-(9,10-diphenyl-2-anthryl)phenyl]-benzo[b]naphtho[1,2-d]furan (abbreviation: 2mBnfPPA), and the like.

The electron-injection layer 115 is provided between the electron-transport layer 114 and the cathode 102. The electron-injection layer 115 contains an organic compound. As the organic compound contained in the electron-injection layer 115, it is possible to use any of the substances that are given as the material with an electron-transport property higher than a hole-transport property in the description of the materials that can be used for the host material. In view of drive voltage, the LUMO level of the organic compound contained in the electron-transport layer 114 is preferably deeper than that of the substance used as the host material. Note that, in this embodiment, an aromatic hydrocarbon which does not have a heteroaromatic ring is not used as a main material of the electron-injection layer 115 because the function as a light-emitting element cannot be obtained. As the organic compound contained in the electron-injection layer 115, it is typically preferable to use Alq, bis(2-methyl-8-quinolinolato)-(4-hydroxybiphenylyl)aluminum (abbreviation: BAlq), bathocuproine (abbreviation: BCP), bathophenanthroline (abbreviation: BPhen), 2,9-bis(naphthalen-2-yl)-4,7-diphenyl-1,10-phenanthroline (abbreviation: NBphen), 3,3',5,5'-tetra[(m-pyridyl)-phen-3-yl]biphenyl (abbreviation: BP4mPy), 2,2'-[2,2'-bipyridine-5,6-diylbis(biphenyl-4,4'-diyl)]bisbenzoxazole (abbreviation: BOxP2BPy), or the like.

Figure 1B:
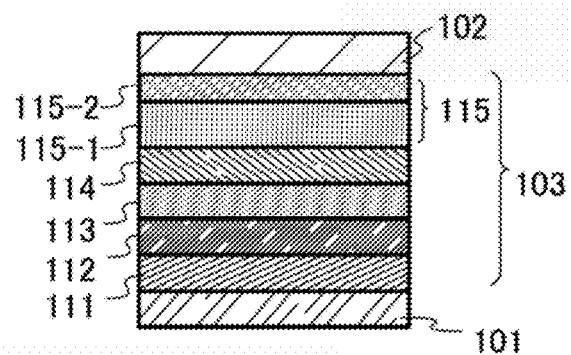

As shown in FIG. 1B, the electron-injection layer 115 may have a stacked structure which contains a layer 115-1 including an organic compound and an electron-injection buffer layer 115-2. The electron-injection buffer layer 115-2 is provided between the layer 115-1 including the organic compound and the cathode 102. For the electron-injection buffer layer, an alkali metal, an alkaline earth metal, and compounds thereof such as lithium, calcium, lithium fluoride (LiF), cesium fluoride (CsF), calcium fluoride ($CaF_2$), or the like can be used. A composite material of a substance having an electron-transport property and a substance exhibiting an electron-donating property (hereinafter, simply referred to as electron-donating substance) with respect to the substance having an electron-transport property can also be used. Examples of the electron-donating substance include the aforementioned alkali metal, alkaline earth metal, and compounds thereof. With this structure, a conductive material as well as a material having a low work function can be used for the cathode.

For the cathode, any of metals, alloys, electrically conductive compounds, and mixtures thereof which have a low work function (specifically, a work function of 3.8 eV or less) or the like can be used. Specific examples of such a cathode material include elements that belong to Groups 1 and 2 of the periodic table, i.e., alkali metals such as lithium (Li) and cesium (Cs), and alkaline earth metals such as magnesium (Mg), calcium (Ca), and strontium (Sr), alloys thereof (e.g., MgAg or AlLi), rare earth metals such as europium (Eu) and ytterbium (Yb), alloys thereof, and the like. However, when the electron-injection buffer layer 115-2 is provided, any of a variety of conductive materials such as Al, Ag, ITO, or indium oxide-tin oxide containing silicon or silicon oxide can be used regardless of the work function.

Films of these electrically conductive materials can be formed by a sputtering method, an inkjet method, a spin coating method, or the like.

Any of a variety of methods can be used to form the EL layer 103 regardless whether it is a dry process or a wet process. For example, a vacuum evaporation method, an inkjet method, a spin coating method, or the like may be used. Different formation methods may be used for the electrodes or the layers.

The electrode may be formed by a wet method using a sol-gel method, or by a wet method using paste of a metal material. Alternatively, the electrode may be formed by a dry method such as a sputtering method or a vacuum evaporation method.

The light-emitting element in this embodiment having the above-described structure suffers less deterioration and specifically, has a smaller drive voltage increase.

Light is extracted out through one or both of the anode 101 and the cathode 102. Therefore, one or both of the anode 101 and the cathode 102 are light-transmitting electrodes. In the case where only the anode 101 is a light-transmitting electrode, light is extracted from the substrate side through the anode 101. In contrast, when only the cathode 102 is a light-transmitting electrode, light is extracted from the side opposite to the substrate side through the cathode 102. In the case where both the anode 101 and the cathode 102 are light-transmitting electrodes, light is extracted from both the substrate side and the side opposite to the substrate side through the anode 101 and the cathode 102.

Embodiment 2

In this embodiment is described one mode of a light-emitting element having a structure in which a plurality of light-emitting units are stacked (hereinafter, also referred to as stacked-type element), with reference to FIG. 2. This light-emitting element includes a plurality of light-emitting units between an anode and a cathode. Each of light-emitting units 511 and 512 has the same structure as the EL layer 103 which is described in Embodiment 1. In other words, the light-emitting element described in Embodiment 1 is a light-emitting element having one light-emitting unit while the light-emitting element described in this embodiment is a light-emitting element having a plurality of light-emitting units.

Figure 2:
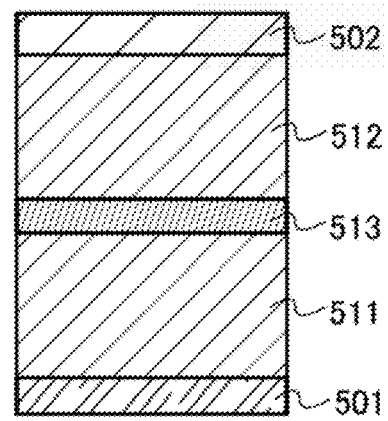
FIG. 2 is a schematic diagram of a light-emitting element.

In FIG. 2, the first light-emitting unit 511 and the second light-emitting unit 512 are stacked between an anode 501 and a cathode 502, and a charge generation layer 513 is provided between the first light-emitting unit 511 and the second light-emitting unit 512. The anode 501 and the cathode 502 respectively correspond to the anode 101 and the cathode 102 in Embodiment 1, and materials described in Embodiment 1 can be used. Further, the structures of the first light-emitting unit 511 and the second light-emitting unit 512 may be the same or different.

The charge generation layer 513 includes a composite material of an organic compound and a metal oxide. As this composite material of an organic compound and a metal oxide, the composite material that can be used for the hole-injection layer and described in Embodiment 1 can be used. Note that in the light-emitting unit whose anode side surface is in contact with the charge generation layer, a hole-transport layer is not necessarily provided because the charge generation layer can also function as the hole-transport layer.

The charge generation layer 513 may have a stacked-layer structure of a layer containing the composite material and a layer containing another material. For example, a layer containing the composite material may be combined with a layer containing a compound selected from electron-donating substances and a compound having a high electron-transport property. Moreover, the charge generation layer 513 may be formed by combining a layer containing the composite material with a transparent conductive film.

The charge generation layer 513 may have any structure as long as electrons can be injected to a light-emitting unit on one side and holes can be injected to a light-emitting unit on the other side when voltage is applied between the anode 501 and the cathode 502. For example, in FIG. 2, any layer can be used as the charge generation layer 513 as long as the layer injects electrons into the first light-emitting unit 511 and holes into the second light-emitting unit 512 when voltage is applied between the anode and the cathode.

Although the light-emitting element having two light-emitting units is described in this embodiment, the present invention can be similarly applied to a light-emitting element in which three or more light-emitting units are stacked. With a plurality of light-emitting units partitioned by the charge generation layer between a pair of electrodes, as in the light-emitting element according to this embodiment, light with high luminance can be obtained while current density is kept low; thus, a light-emitting element having a long lifetime can be obtained. In addition, a low power consumption light-emitting device which can be driven at low voltage can be provided.

By making the light-emitting units emit light of different colors from each other, the light-emitting element can provide light emission of a desired color as a whole. For example, by forming a light-emitting element having two light-emitting units such that the emission color of the first light-emitting unit and the emission color of the second light-emitting unit are complementary colors, the light-emitting element can provide white light emission as a whole. Note that the word "complementary" means color relationship in which an achromatic color is obtained when colors are mixed. In other words, when light components obtained from substances which emit light of complementary colors are mixed, white light emission can be obtained. Further, the same can be applied to a light-emitting element having three light-emitting units. For example, the light-emitting element as a whole can provide white light emission when the emission color of the first light-emitting unit is red, the emission color of the second light-emitting unit is green, and the emission color of the third light-emitting unit is blue. Alternatively, in the case of employing a light-emitting element in which a phosphorescent substance is used for a light-emitting layer of one light-emitting unit and a fluorescent substance is used for a light-emitting layer of the other light-emitting unit, both fluorescence and phosphorescence can be efficiently emitted from the light-emitting element. For example, when red phosphorescence and green phosphorescence are obtained from one light-emitting unit and blue fluorescence is obtained from the other light-emitting unit, white light with high emission efficiency can be obtained.

Note that this embodiment can be combined with any of other embodiments as appropriate.

Embodiment 3

In this embodiment, explanation will be given with reference to FIGS. 3A and 3B of an example of the light-emitting device fabricated using the light-emitting element described in Embodiment 1 or 2. Note that FIG. 3A is a top view of the light-emitting device and FIG. 3B is a cross-sectional view taken along the lines A-B and C-D in FIG. 3A. This light-emitting device includes a driver circuit portion (source side driver circuit) 601, a pixel portion 602, and a driver circuit portion (gate side driver circuit) 603, which control light emission of a light-emitting element and are denoted by dotted lines. A reference numeral 604 denotes a sealing substrate; 605, a sealant; and 607, a space surrounded by the sealant 605.

Reference numeral 608 denotes a wiring for transmitting signals to be input to the source side driver circuit 601 and the gate side driver circuit 603 and receiving signals such as a video signal, a clock signal, a start signal, and a reset signal from a flexible printed circuit (FPC) 609 serving as an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

Next, a cross-sectional structure is explained with reference to FIG. 3B. The driver circuit portions 601 and 603 and the pixel portion 602 are formed over an element substrate 610: here, the source side driver circuit 601, which is a driver circuit portion, and one of the pixels in the pixel portion 602 are shown.

As the source side driver circuit 601, a CMOS circuit in which an n-channel transistor 623 and a p-channel transistor 624 are combined is formed. The driver circuit may be formed with any of a variety of circuits such as a CMOS circuit, a PMOS circuit, and an NMOS circuit. Although a driver integrated type in which the driver circuit is formed over the substrate is described in this embodiment, the driver circuit is not necessarily formed over the substrate, and the driver circuit can be formed outside, not over the substrate. Either a staggered transistor or an inverted staggered transistor may be employed. A semiconductor layer for forming the transistors may be formed using any material as long as the material exhibits semiconductor characteristics; for example, an element belonging to Group 14 of the periodic table such as silicon (Si) and germanium (Ge), a compound such as gallium arsenide and indium phosphide, and an oxide such as zinc oxide and tin oxide can be given. For the oxide exhibiting semiconductor characteristics (oxide semiconductor), a composite oxide of an element selected from indium, gallium, aluminum, zinc, and tin can be used. Examples thereof are zinc oxide (ZnO), indium oxide containing zinc oxide (indium zinc oxide), and oxide containing indium oxide, gallium oxide, and zinc oxide (IGZO: indium gallium zinc oxide). An organic semiconductor may also be used. The semiconductor layer may have either a crystalline structure or an amorphous structure. Specific examples of the crystalline semiconductor layer are a single crystal semiconductor, a polycrystalline semiconductor, and a microcrystalline semiconductor.

The pixel portion 602 includes a plurality of pixels including a switching transistor 611, a current controlling transistor 612, and an anode 613 electrically connected to a drain of the current controlling transistor 612. Note that to cover an end portion of the anode 613, an insulator 614 is formed, for which a positive photosensitive resin film is used here.

In order to improve coverage with a film formed over the insulator 614, the insulator 614 is formed to have a curved surface at its upper or lower end portion. For example, in the case where a positive photosensitive acrylic resin is used, the insulator 614 is preferably formed so that its upper end portion of the insulator 614 has a surface with a curvature radius (0.2 μm to 3 μm). As the insulator 614, either a negative photosensitive material or a positive photosensitive material can be used.

An EL layer 616 and a cathode 617 are formed over the anode 613. As a material used for the anode 613, the materials described in Embodiment 1 can be used. For example, a stack including a titanium nitride film and a film containing aluminum as its main component, a stack including three layers of a titanium nitride film, a film containing aluminum as its main component, and a titanium nitride film, or the like can be used. The stacked structure achieves low wiring resistance and a favorable ohmic contact.

The EL layer 616 is formed by any of a variety of methods such as an evaporation method using an evaporation mask, an inkjet method, and a spin coating method. For another material included in the EL layer 616, any of low molecular-weight compounds and high molecular-weight compounds (including oligomers and dendrimers) may be used.

As a material used for the cathode 617, those described in Embodiment 1 can be used. In the case where light generated in the EL layer 616 passes through the cathode 617, a stack including a thin metal film and a transparent conductive film (e.g., ITO, indium oxide containing zinc oxide at 2 wt % to 20 wt %, indium tin oxide containing silicon, or zinc oxide (ZnO)) is preferably used for the cathode 617.

Note that a light-emitting element 618 is formed with the anode 613, the EL layer 616, and the cathode 617. The light-emitting element has the structure described in Embodiment 1 or 2. In the light-emitting device in this embodiment, the pixel portion 602, which includes a plurality of light-emitting elements, may include both the light-emitting element with the structure described in Embodiment 1 or 2 and a light-emitting element with a structure other than those structures.

The sealing substrate 604 is attached to the element substrate 610 with the sealant 605, so that the light-emitting element 618 is provided in the space 607 surrounded by the element substrate 610, the sealing substrate 604, and the sealant 605. The space 607 is filled with filler. The filler may be an inert gas (such as nitrogen or argon), or a resin and/or a desiccant.

An epoxy-based resin or glass frit is preferably used for the sealant 605. It is preferable that such a material do not transmit moisture or oxygen as much as possible. As the element substrate 610 and the sealing substrate 604, a glass substrate, a quartz substrate, or a plastic substrate formed of fiber reinforced plastic (FRP), poly(vinyl fluoride) (PVF), a polyester, an acrylic resin, or the like can be used.

FIGS. 4A and 4B illustrate examples of light-emitting devices in which full color display is achieved by forming a white-emissive light-emitting element and providing a coloring layer (a color filter) and the like. In FIG. 4A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, anodes 1024W, 1024R, 1024G, and 1024B of light-emitting elements, a partition wall 1025, an EL layer 1028, a cathode 1029 of the light-emitting elements, a sealing substrate 1031, a sealant 1032, and the like are illustrated.

In FIG. 4A, coloring layers (a red coloring layer 1034R, a green coloring layer 1034G, and a blue coloring layer 1034B) are provided on a transparent base material 1033. Further, a black layer (a black matrix) 1035 may be additionally provided. The transparent base material 1033 provided with the coloring layers and the black layer is fixed to the substrate 1001. Note that the coloring layers and the black layer are covered with an overcoat layer 1036. As shown in FIG. 4A, emitted light is extracted without passing through any of the coloring layers in an emission region 1044W, while the emitted light is extracted through the coloring layers in emission regions 1044R, 1044B, and 1044G. Since light which does not pass through the coloring layers is white and light which passes through any one of the coloring layers is red, blue, or green, an image can be displayed using pixels of the four colors.

FIG. 4B illustrates an example in which coloring layers (the red coloring layer 1034R, the green coloring layer 1034G, and the blue coloring layer 1034B) are formed between the gate insulating film 1003 and the first interlayer insulating film 1020. As shown in FIG. 4B, the coloring layers may be provided between the substrate 1001 and the sealing substrate 1031.

Figure 5:
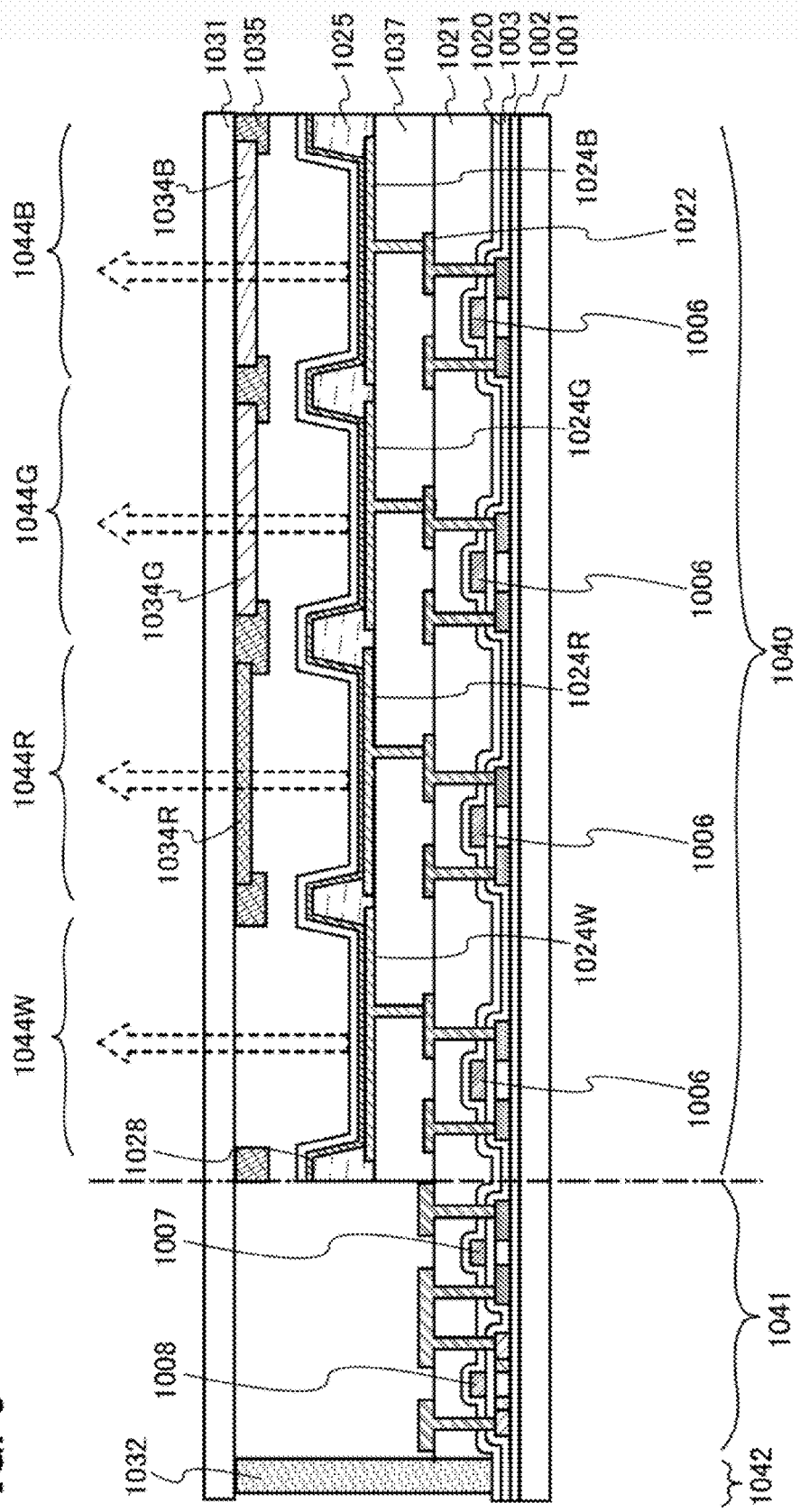
FIG. 5 is a schematic diagram of an active matrix light-emitting device.

The above-described light-emitting devices have a structure in which light is extracted from the substrate 1001 side where the transistors are formed (a bottom emission structure), but may have a structure in which light is extracted from the sealing substrate 1031 side (a top emission structure). FIG. 5 is a cross-sectional view of a light-emitting device having a top emission structure. In this case, a substrate which does not transmit light can be used as the substrate 1001.

The anodes 1024W, 1024R, 1024G, and 1024B are reflective electrodes. The EL layer 1028 is formed to have the structure described in Embodiment 1 or 2, with which white light emission can be obtained. Here, a third interlayer insulating film 1037 is provided over the second interlayer insulating film 1021 to cover an electrode 1022.

For example, a plurality of light-emitting layers are used or a plurality of light-emitting units are employed.

In the case of a top emission structure as illustrated in FIG. 5, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer 1035 which is positioned between pixels. The coloring layers and the black layer may be covered with an overcoat layer. Note that a light-transmitting substrate is used as the sealing substrate 1031.

Although an example in which full color display is performed using four colors of red, green, blue, and white is shown here, there is no particular limitation and full color display using three colors of red, green, and blue may be performed.

Since the light-emitting device in this embodiment uses the light-emitting element described in Embodiment 1 or 2, which suffers less deterioration and specifically, has a smaller drive voltage increase, the light-emitting device can have high reliability.

Figure 6A:
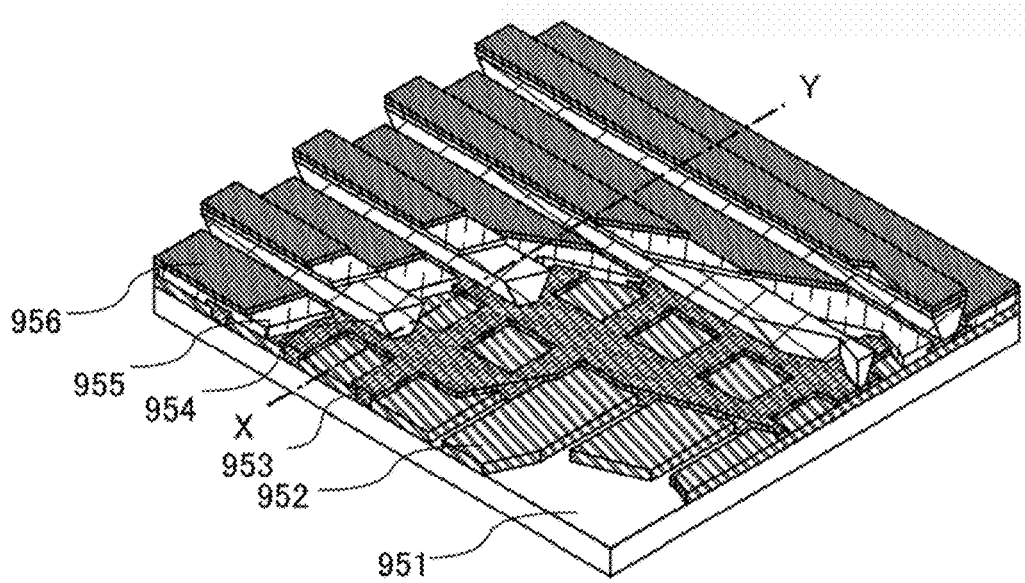
FIGS. 6A and 6B are schematic diagrams of a passive matrix light-emitting device.
Figure 6B:
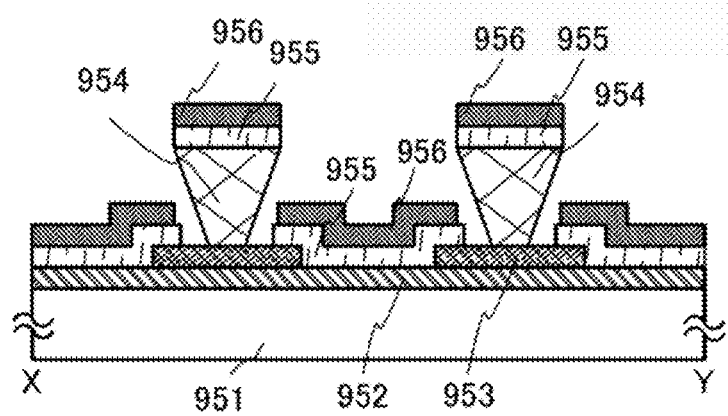

An active matrix light-emitting device is described above, whereas a passive matrix light-emitting device is described below. FIGS. 6A and 6B illustrate a passive matrix light-emitting device fabricated by application of the present invention. FIG. 6A is a perspective view of the light-emitting device, and FIG. 6B is a cross-sectional view of FIG. 6A taken along line X-Y. In FIGS. 6A and 6B, over a substrate 951, an EL layer 955 is provided between an electrode 952 and an electrode 956. An edge portion of the electrode 952 is covered with an insulating layer 953. A partition layer 954 is provided over the insulating layer 953. The sidewalls of the partition layer 954 slope so that the distance between one sidewall and the other sidewall gradually decreases toward the surface of the substrate. In other words, a cross section taken along the direction of the short side of the partition layer 954 is trapezoidal, and the base (a side in contact with the insulating layer 953) is shorter than the upper side (a side not in contact with the insulating layer 953). By providing the partition layer 954 in such a manner, a defect of the light-emitting element due to crosstalk can be prevented. The passive matrix light-emitting device can have high reliability by including the light-emitting element described in Embodiment 1 or 2, which exhibits high emission efficiency, suffers less deterioration, and specifically, has a smaller drive voltage increase.

Since many minute light-emitting elements arranged in a matrix in the light-emitting device described above can each be controlled, the light-emitting device can be suitably used as a display device for displaying images.

Embodiment 4

In this embodiment, electronic devices and lighting devices each including the light-emitting element described in Embodiment 1 or 2 will be described. The light-emitting element described in Embodiment 1 or 2 suffers less deterioration and specifically, has a smaller drive voltage increase: as a result, the electronic devices including a display portion and the lighting devices can each have high reliability.

Examples of the electronic device that uses the above light-emitting element include television devices (also referred to as TV or television receivers), monitors for computers and the like, cameras such as digital cameras and digital video cameras, digital photo frames, mobile phones (also referred to as cellular phones or cellular phone devices), portable game machines, portable information terminals, audio playback devices, large game machines such as pachinko machines, and the like. Specific examples of these electronic devices are given below.

FIG. 7A illustrates an example of a television device. In the television device, a display portion 7103 is incorporated in a housing 7101. Here, the housing 7101 is supported by a stand 7105. The display portion 7103 enables display of images and includes the light-emitting elements which are the same as the light-emitting element described in Embodiment 1 or 2 and arranged in a matrix. Each of the light-emitting elements suffers less deterioration and specifically, has a smaller drive voltage increase. Therefore, the television device including the display portion 7103 which is formed using the light-emitting elements can have high reliability and a small increase in drive voltage.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

FIG. 7B illustrates a computer, which includes a main body 7201, a housing 7202, a display portion 7203, a keyboard 7204, an external connection port 7205, a pointing device 7206, and the like. Note that this computer is fabricated by using the light-emitting elements which are the same as the light-emitting element described in Embodiment 1 or 2 and arranged in a matrix in the display portion 7203. Each of the light-emitting elements suffers less deterioration and specifically, has a smaller drive voltage increase. Therefore, the computer including the display portion 7203 which is formed using the light-emitting elements can have high reliability.

FIG. 7C illustrates a portable game machine having two housings, a housing 7301 and a housing 7302, which are connected with a joint portion 7303 so that the portable game machine can be opened or folded. A display portion 7304 including the light-emitting elements which are the same as the light-emitting element described in Embodiment 1 or 2 and arranged in a matrix is incorporated in the housing 7301, and a display portion 7305 is incorporated in the housing 7302. In addition, the portable game machine illustrated in FIG. 7C includes a speaker portion 7306, a recording medium insertion portion 7307, an LED lamp 7308, an input unit (an operation key 7309, a connection terminal 7310, and a microphone 7312), a sensor 7311 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and the like. Needless to say, the structure of the portable game machine is not limited to the above structure as far as the display portion including the light-emitting elements which are the same as the light-emitting element described in Embodiment 1 or 2 and arranged in a matrix is used as at least either the display portion 7304 or the display portion 7305, or both. The portable game machine can include other accessories as appropriate. The portable game machine illustrated in FIG. 7C has a function of reading out a program or data stored in a storage medium to display it on the display portion, and a function of sharing information with another portable game machine by wireless communication. The portable game machine illustrated in FIG. 7C can have a variety of functions without limitation to the above functions. Since the light-emitting elements used in the display portion 7304 suffer less deterioration and specifically, have a smaller drive voltage increase, the portable game machine including the above-described display portion 7304 can be a portable game machine having high reliability.

FIG. 7D illustrates an example of a mobile phone. The mobile phone is provided with a display portion 7402 incorporated in a housing 7401, operation buttons 7403, an external connection port 7404, a speaker 7405, a microphone 7406, and the like. Note that the mobile phone has the display portion 7402 including the light-emitting elements which are the same as the light-emitting element described in Embodiment 1 or 2 and arranged in a matrix. Each of the light-emitting elements suffers less deterioration and specifically, has a smaller drive voltage increase. Therefore, the mobile phone including the display portion 7402 which is formed using the light-emitting elements can have high reliability.

When the display portion 7402 of the mobile phone illustrated in FIG. 7D is touched with a finger or the like, data can be input into the mobile phone. In this case, operations such as making a call and creating e-mail can be performed by touching the display portion 7402 with a finger or the like.

There are mainly three screen modes of the display portion 7402. The first mode is a display mode mainly for displaying an image. The second mode is an input mode mainly for inputting information such as characters. The third mode is a display-and-input mode in which two modes of the display mode and the input mode are combined.

For example, in the case of making a call or creating e-mail, a character input mode mainly for inputting characters is selected for the display portion 7402 so that characters displayed on a screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone, display on the screen of the display portion 7402 can be automatically changed by determining the orientation of the mobile phone (whether the mobile phone is placed horizontally or vertically for a landscape mode or a portrait mode).

The screen modes are switched by touch on the display portion 7402 or operation with the operation buttons 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

In the input mode, when input by touching the display portion 7402 is judged not to have been performed for a certain period by an optical sensor in the display portion 7402, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

The light-emitting element described in Embodiment 1 or 2 can also be used for a light source device. One mode of the use of the light-emitting element in a light source device is described with reference to FIG. 8. Note that the light source device includes a light-emitting element as a light irradiation unit and at least includes an input-output terminal portion which supplies current to the light-emitting element.

Figure 8:
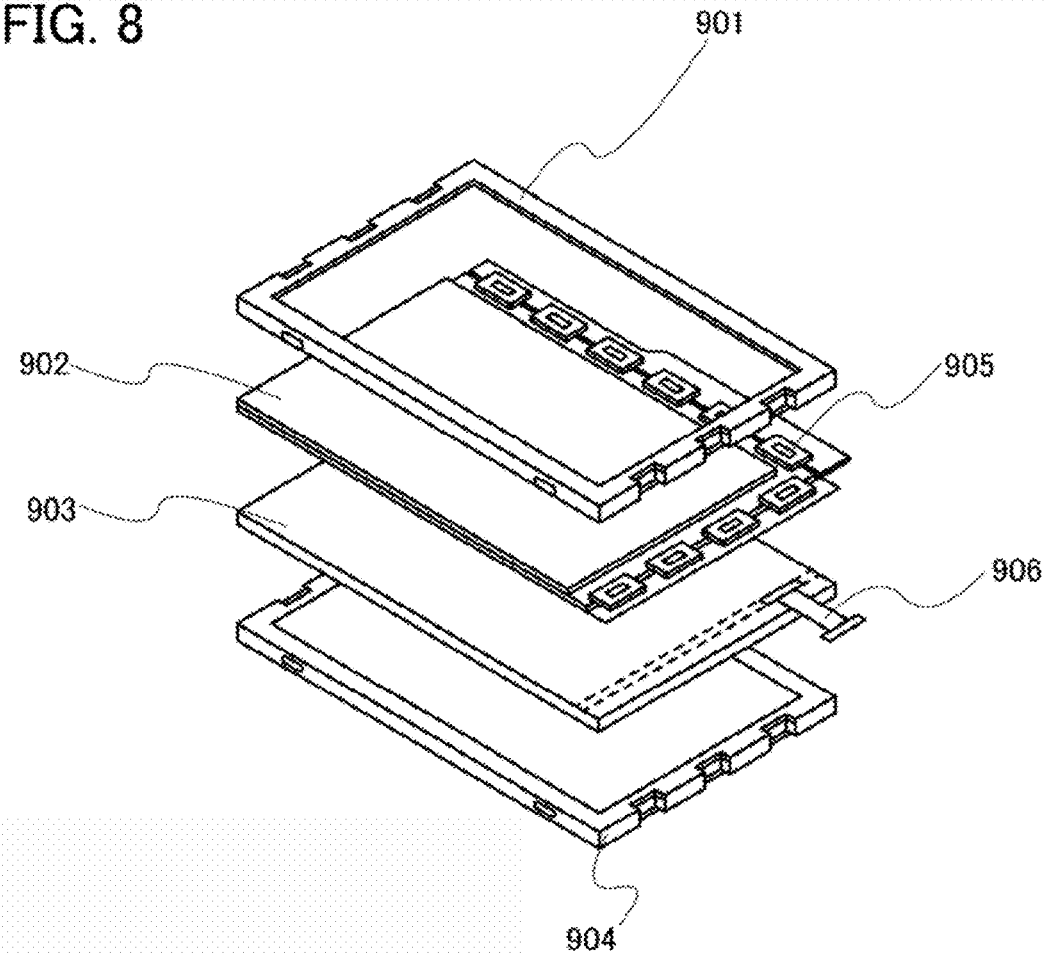
FIG. 8 illustrates a light source device.

FIG. 8 illustrates an example of a liquid crystal display device using the light-emitting element described in Embodiment 1 or 2 for a backlight. The liquid crystal display device illustrated in FIG. 8 includes a housing 901, a liquid crystal layer 902, a backlight 903, and a housing 904. The liquid crystal layer 902 is connected to a driver IC 905. The light-emitting element of one embodiment of the present invention is used in the backlight 903, to which current is supplied through a terminal 906.

The light-emitting element of one embodiment of the present invention is used for the backlight of the liquid crystal display device; thus, the backlight can have reduced power consumption. In addition, the use of the light-emitting element of one embodiment of the present invention enables fabrication of a planar-emission lighting device and further a larger-area planar-emission lighting device; therefore, the backlight can be a larger-area backlight, and the liquid crystal display device can also be a larger-area device. Furthermore, the backlight using the light-emitting element of one embodiment of the present invention can be thinner than a conventional one; accordingly, the display device can also be thinner.

Figure 9:
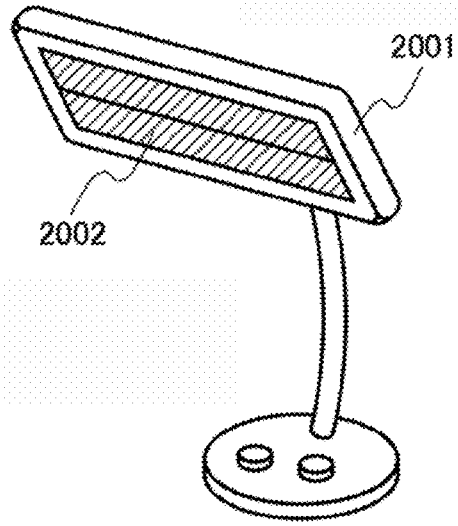
FIG. 9 illustrates a lighting device.

FIG. 9 illustrates an example in which the light-emitting element described in Embodiment 1 or 2 is used for a table lamp which is a lighting device. The table lamp illustrated in FIG. 9 includes a housing 2001 and a light source 2002, and the above light-emitting element is used for the light source 2002.

Figure 10:
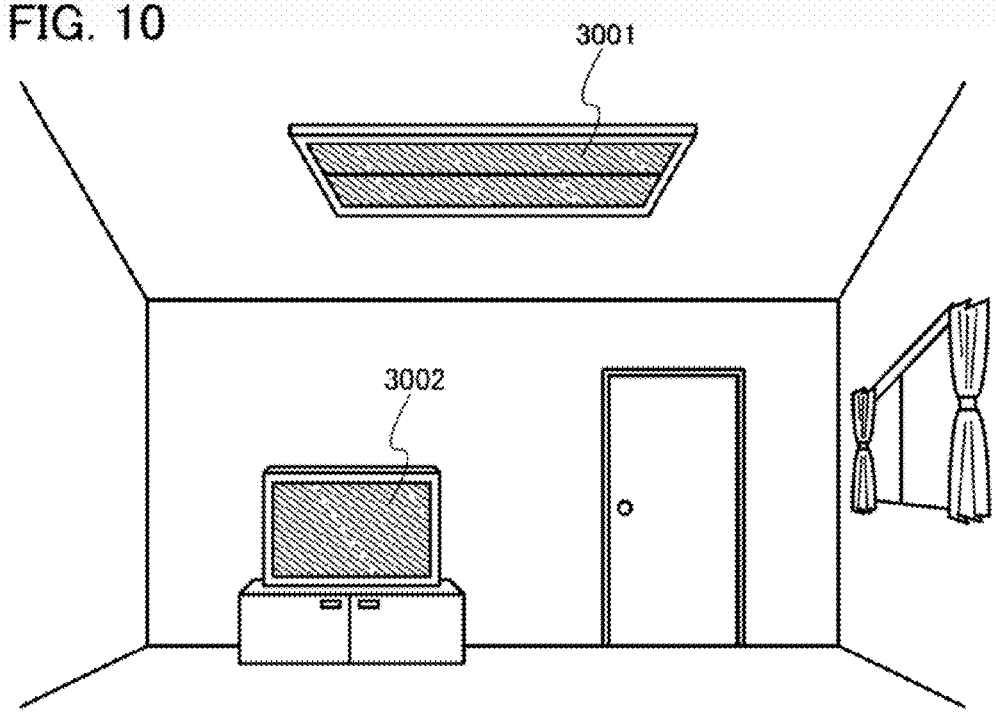
FIG. 10 illustrates a lighting device and an electronic device.

FIG. 10 illustrates an example in which the light-emitting element described in Embodiment 1 or 2 is used for an indoor lighting device 3001 and a television device 3002. Since the above light-emitting element has reduced power consumption, a lighting device that has reduced power consumption can be obtained. Further, since the above light-emitting element can have a large area, the above light-emitting element can be used for a large-area lighting device. Furthermore, since the above light-emitting element is thin, a lighting device having a reduced thickness can be fabricated.

Figure 11:
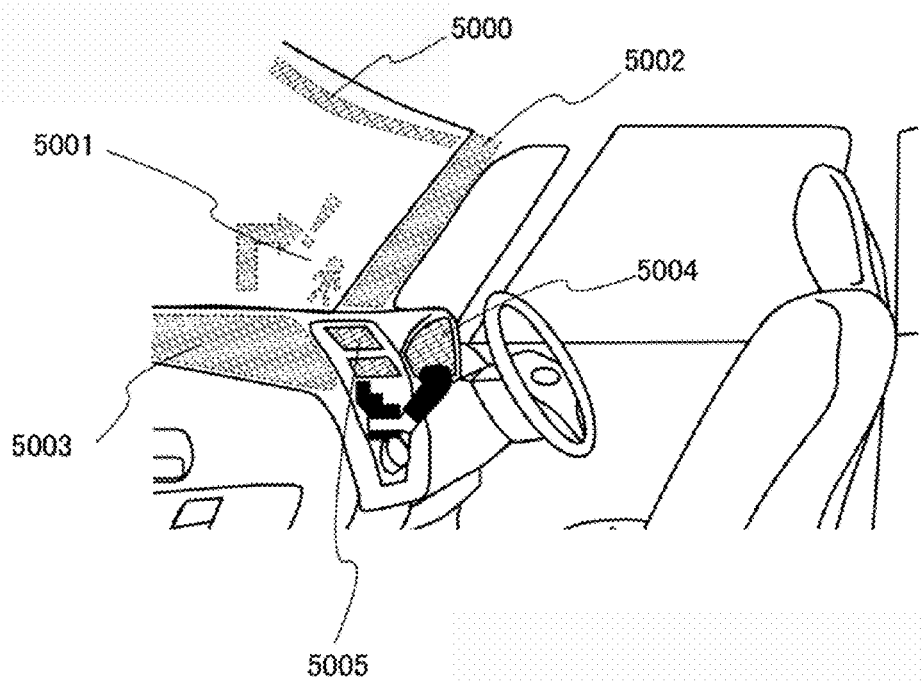
FIG. 11 illustrates in-vehicle display devices and lighting devices.

The light-emitting element described in Embodiment 1 or 2 can also be used for an automobile windshield or an automobile dashboard. FIG. 11 illustrates one mode in which the above light-emitting elements are used for an automobile windshield and an automobile dashboard. Display regions 5000 to 5005 each include the above light-emitting element.

The display regions 5000 and 5001 are display devices which are provided in the automobile windshield and in which the above light-emitting elements are incorporated. The above light-emitting element can be formed into a so-called see-through display device, through which the opposite side can be seen, by including an anode and a cathode formed of electrodes having light-transmitting properties. Such see-through display devices can be provided in the windshield of the car, without hindering the vision. Note that in the case where a transistor for driving the light-emitting element is provided, a transistor having a light-transmitting property, such as an organic transistor using an organic semiconductor material or a transistor using an oxide semiconductor, is preferably used.

The display region 5002 is a display device which is provided in a pillar portion and in which the above light-emitting element is incorporated. The display region 5002 can compensate for the view hindered by the pillar portion by showing an image taken by an imaging unit provided in the car body. Similarly, the display region 5003 provided in the dashboard can compensate for the view hindered by the car body by showing an image taken by an imaging unit provided in the outside of the car body, which leads to elimination of blind areas and enhancement of safety. Showing an image so as to compensate for the area which a driver cannot see makes it possible for the driver to confirm safety easily and comfortably.

The display region 5004 and the display region 5005 can provide a variety of information by displaying navigation data, speed, the number of revolutions, a mileage, a fuel meter, a gearshift indicator, and air-condition setting. The content or layout of the display can be changed freely by a user. Note that such information can also be shown by the display regions 5000 to 5003. The display regions 5000 to 5005 can also be used as lighting devices.

The light-emitting element described in Embodiment 1 or 2 suffers less deterioration and specifically, has a smaller drive voltage increase. Accordingly, the display regions 5000 to 5005 can have high reliability and can be favorably used for in-vehicle display devices, in-vehicle light-emitting devices, or in-vehicle lighting devices, which need to meet strict standards.

Figure 12A:
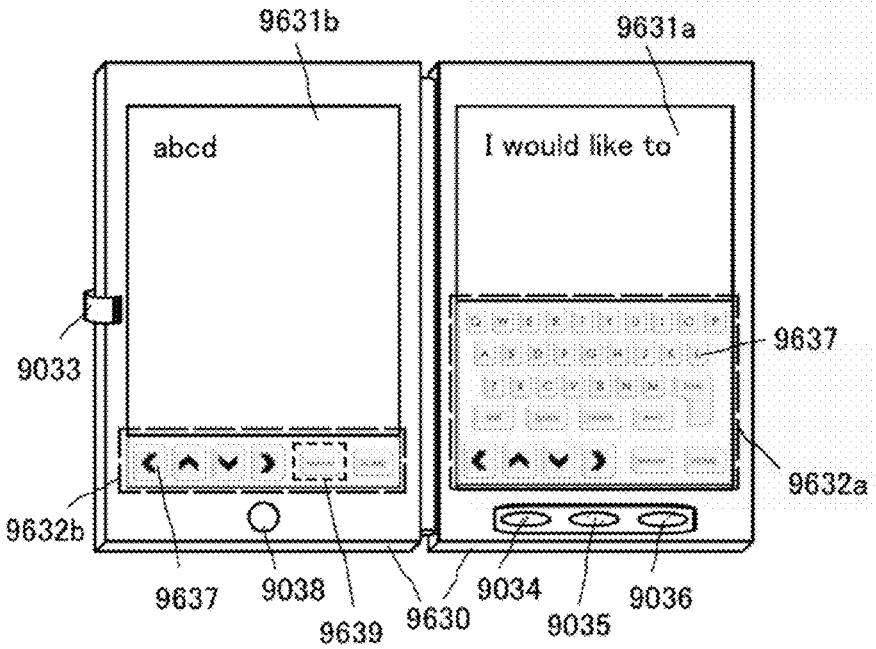
FIGS. 12A to 12C illustrate an electronic device.
Figure 12B:
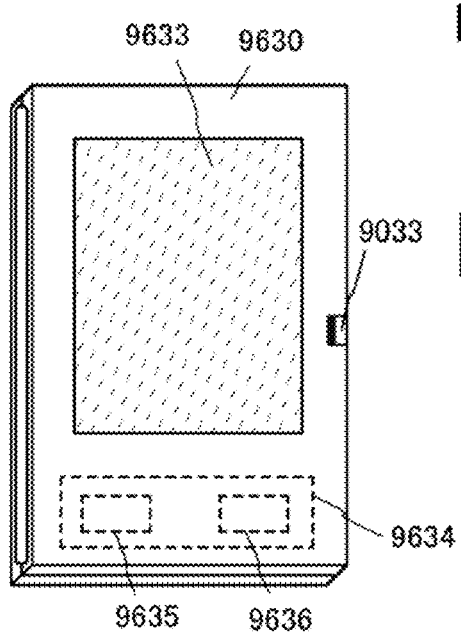

FIGS. 12A and 12B illustrate an example of a foldable tablet terminal. FIG. 12A illustrates the tablet terminal which is unfolded. The tablet terminal includes a housing 9630, a display portion 9631a, a display portion 9631b, a display mode switch 9034, a power switch 9035, a power-saving mode switch 9036, a clasp 9033, and an operation switch 9038. Note that in the tablet terminal, one or both of the display portion 9631a and the display portion 9631b is/are formed using a light-emitting device which includes the light-emitting element of one embodiment of the present invention.

Part of the display portion 9631a can be a touchscreen region 9632a and data can be input when a displayed operation key 9637 is touched. Although half of the display portion 9631a has only a display function and the other half has a touchscreen function, one embodiment of the present invention is not limited to the structure. The whole display portion 9631a may have a touchscreen function. For example, a keyboard is displayed on the entire region of the display portion 9631a so that the display portion 9631a is used as a touchscreen; thus, the display portion 9631b can be used as a display screen.

Like the display portion 9631a, part of the display portion 9631b can be a touchscreen region 9632b. When a keyboard display switching button 9639 displayed on the touchscreen is touched with a finger, a stylus, or the like, the keyboard can be displayed on the display portion 9631b.

Touch input can be performed in the touchscreen region 9632a and the touchscreen region 9632b at the same time.

The display mode switch 9034 can switch the display between portrait mode, landscape mode, and the like, and between monochrome display and color display, for example. The power-saving switch 9036 can control display luminance in accordance with the amount of external light in use of the tablet terminal detected by an optical sensor incorporated in the tablet terminal. Another detection device including a sensor for detecting inclination, such as a gyroscope or an acceleration sensor, may be incorporated in the tablet terminal, in addition to the optical sensor.

Although FIG. 12A illustrates an example in which the display portion 9631a and the display portion 9631b have the same display area, one embodiment of the present invention is not limited to the example. The display portion 9631a and the display portion 9631b may have different display areas and different display quality. For example, one of them may be a display panel that can display higher-definition images than the other.

FIG. 12B illustrates the tablet terminal which is folded. The tablet terminal includes the housing 9630, a solar cell 9633, a charge and discharge control circuit 9634, a battery 9635, and a DC-to-DC converter 9636. As an example, FIG. 12B illustrates the charge and discharge control circuit 9634 including the battery 9635 and the DC-to-DC converter 9636.

Since the tablet terminal is foldable, the housing 9630 can be closed when the tablet terminal is not in use. As a result, the display portion 9631a and the display portion 9631b can be protected, thereby providing a tablet terminal with high endurance and high reliability in terms of long-term use.

The tablet terminal illustrated in FIGS. 12A and 12B can have other functions such as a function of displaying various kinds of data (e.g., a still image, a moving image, and a text image), a function of displaying a calendar, a date, the time, or the like on the display portion, a touch-input function operating or editing the data displayed on the display portion by touch input, and a function of controlling processing by various kinds of software (programs).

The solar cell 9633 provided on a surface of the tablet terminal can supply power to the touchscreen, the display portion, a video signal processing portion, or the like. Note that the solar cell 9633 is preferably provided on one or two surfaces of the housing 9630, in which case the battery 9635 can be charged efficiently.

Figure 12C:
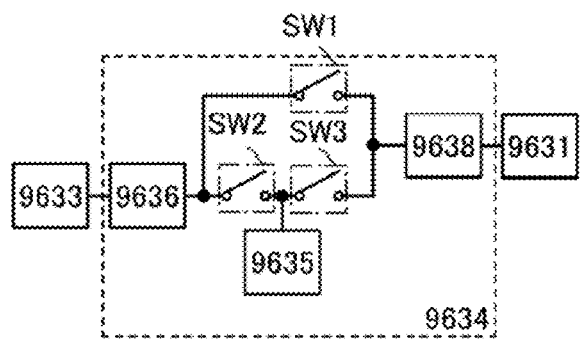

The structure and operation of the charge and discharge control circuit 9634 illustrated in FIG. 12B will be described with reference to a block diagram of FIG. 12C. FIG. 12C illustrates the solar cell 9633, the battery 9635, the DC-to-DC converter 9636, a converter 9638, switches SW1 to SW3, and the display portion 9631. The battery 9635, the DC-to-DC converter 9636, the converter 9638, and the switches SW1 to SW3 correspond to the charge and discharge control circuit 9634 illustrated in FIG. 12B.

First, description is made on an example of the operation in the case where power is generated by the solar cell 9633 with the use of external light. The voltage of the power generated by the solar cell is raised or lowered by the DC-to-DC converter 9636 so as to be voltage for charging the battery 9635. Then, when power supplied from the battery 9635 charged by the solar cell 9633 is used for the operation of the display portion 9631, the switch SW1 is turned on and the voltage of the power is raised or lowered by the converter 9638 so as to be voltage needed for the display portion 9631. When images are not displayed on the display portion 9631, the switch SW1 is turned off and the switch SW2 is turned on so that the battery 9635 is charged.

Although the solar cell 9633 is described as an example of a power generation unit, the power generation unit is not particularly limited, and the battery 9635 may be charged by another power generation unit such as a piezoelectric element or a thermoelectric conversion element (Peltier element). The battery 9635 may be charged by a non-contact power transmission module which is capable of charging by transmitting and receiving power by wireless (without contact), or another charge unit used in combination, and the power generation unit is not necessarily provided.

One embodiment of the present invention is not limited to the electronic device having the shape illustrated in FIGS. 12A to 12C as long as the display portion 9631 is included.

Note that the structure described in this embodiment can be combined with any of the structures described in Embodiments 1 to 3 as appropriate.

As described above, the application range of the light-emitting device having the light-emitting element described in Embodiment 1 or 2 is extremely wide so that this light-emitting device can be utilized in electronic devices and lighting devices in a variety of fields. By including the light-emitting element, an electronic device and a lighting device can have high reliability.

Example 1

In this example, the light-emitting elements described in Embodiment 1 (a light-emitting element 1 (element 1) and a light-emitting element 2 (element 2)) will be described. The light-emitting elements in this example each include a blue-emissive phosphorescent substance. A light-emitting element (a comparative light-emitting element 1 (reference element 1)) in which a material of an electron-transport layer is a substance without an anthracene skeleton was also fabricated as a comparative example.

Molecular structures of organic compounds that were used in this example are shown by Structural Formulae (i) to (vii) below. The element structure in FIG. 1 was employed.

(i)

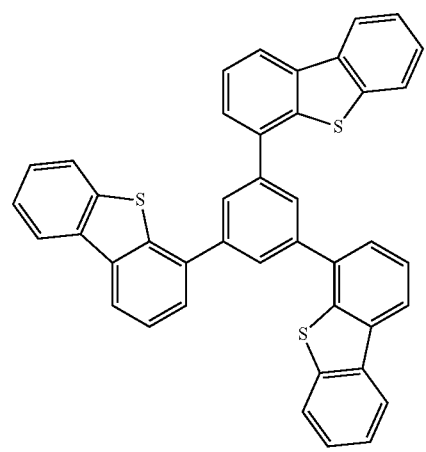

DBT3P-II (ii)

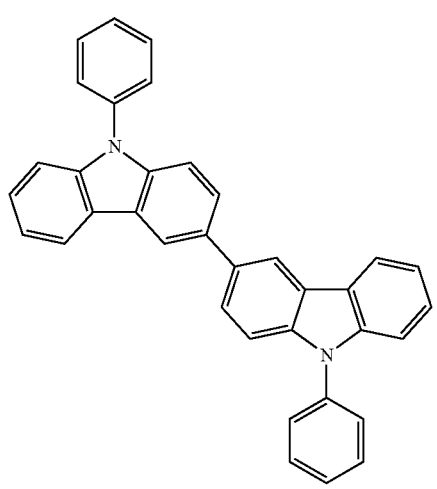

PCCP

-continued (iii)

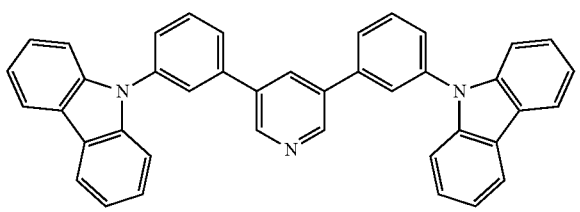

35DCzPPy (iv)

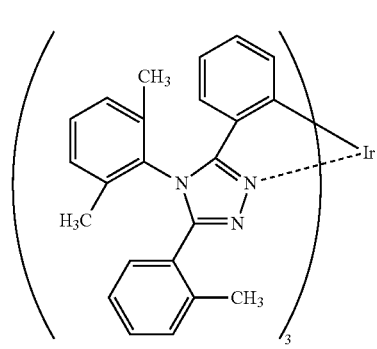

Ir(mpptz-dmp)$_3$ (v)

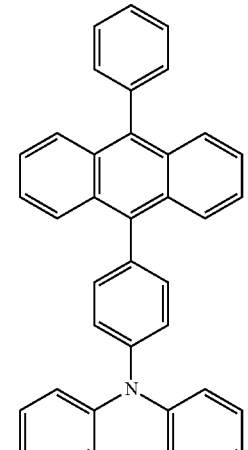

CzPA (vi)

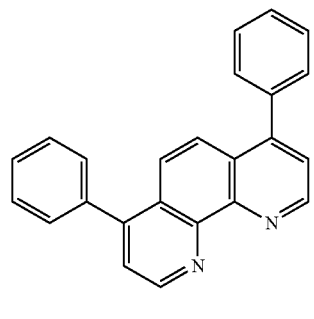

BPhen (vii)

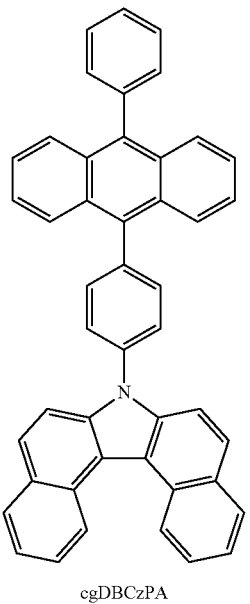

cgDBCzPA

<<Fabrication of Light-Emitting Element 1>

First, a glass substrate, over which a film of indium tin oxide containing silicon (ITSO) was formed to a thickness of 110 nm as the anode 101, was prepared. A surface of the ITSO film was covered with a polyimide film so that an area of 2 mm×2 mm of the surface was exposed. The electrode area was 2 mm×2 mm. As pretreatment for forming the light-emitting element over the substrate, the surface of the substrate was washed with water and baked at 200° C. for 1 hour, and then UV-ozone treatment was performed for 370 seconds. After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate was fixed to a holder provided in the vacuum evaporation apparatus so that the surface provided with ITSO faced downward.

The pressure in the vacuum evaporation apparatus was reduced to $10^{-4}$ Pa. Then, 4,4',4"-(benzene-1,3,5-triyl)tri(dibenzothiophene) (abbreviation: DBT3P-II) represented by Structural Formula (i) and molybdenum(VI) oxide were deposited by co-evaporation so that DBT3P-II:molybdenum oxide=4:2 (weight ratio), whereby the hole-injection layer 111 was formed. The thickness was set to 60 nm.

Next, 3,3'-bis(9-phenyl-9H-carbazole) (abbreviation: PCCP) represented by Structural Formula (ii) was deposited by evaporation to a thickness of 20 nm, whereby the hole-transport layer 112 was formed.

Then, PCCP, 3,5-[bis(9H-carbazol-9-yl)phenyl]pyridine (abbreviation: 35DCzPPy) represented by Structural Formula (iii), and tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]) represented by Structural Formula (iv) were deposited by co-evaporation to a thickness of 30 nm on the hole-transport layer 112 so that PCCP:35DCzPPy:[Ir(mpptz-dmp)$_3$]=1:0.3:0.06 (weight ratio), and then, 35DCzPPy and [Ir(mpptz-dmp)$_3$] were deposited by co-evaporation to a thickness of 10 nm so that 35DCzPPy:[Ir(mpptz-dmp)$_3$]=1:0.06 (weight ratio), whereby the light-emitting layer 113 was formed.

Next, 9-[4-(10-phenyl-9-anthryl)phenyl]-9H-carbazole (abbreviation: CzPA) represented by Structural Formula (v) was deposited by evaporation to a thickness of 10 nm, whereby the electron-transport layer 114 was formed.

Then, bathophenanthroline (abbreviation: BPhen) represented by Structural Formula (vi) was deposited by evaporation to a thickness of 15 nm on the electron-transport layer 114.

Lithium fluoride was then deposited by evaporation to a thickness of 1 nm as an electron-injection buffer layer, whereby the electron-injection layer 115 was formed. Lastly, a film of aluminum was formed to a thickness of 200 nm as the cathode 102. Thus, the light-emitting element 1 was completed. Note that in all the above evaporation steps, evaporation was performed by a resistance-heating method.

<<Fabrication of Light-Emitting Element 2>>

The light-emitting element 2 was fabricated in the same manner as the light-emitting element 1 except that 7-[4-(10-phenyl-9-anthryl)phenyl]-7H-dibenzo[c,g]carbazole (abbreviation: cgDBCzPA) represented by Structural Formula (vii) was used as a material of the electron-transport layer 114 instead of CzPA.

<<Fabrication of Comparative Light-Emitting Element 1>>

The comparative light-emitting element 1 was fabricated in the same manner as the light-emitting element 1 except that 35DCzPPy was used as a material of the electron-transport layer 114 instead of CzPA.

<<Operation Characteristics of Light-Emitting Element 1, Light-Emitting Element 2, and Comparative Light-Emitting Element 1>>

The light-emitting element 1, the light-emitting element 2, and the comparative light-emitting element 1 obtained as described above were sealed in a glove box containing a nitrogen atmosphere so as not to be exposed to the air (specifically, a sealant was applied onto an outer edge of each element, and heat treatment at 80° C. for 1 hour and UV treatment were performed at the time of sealing). Then, the operation characteristics of the light-emitting elements were measured. Note that the measurements were carried out at room temperature (in an atmosphere kept at 25° C.).

Figure 13:
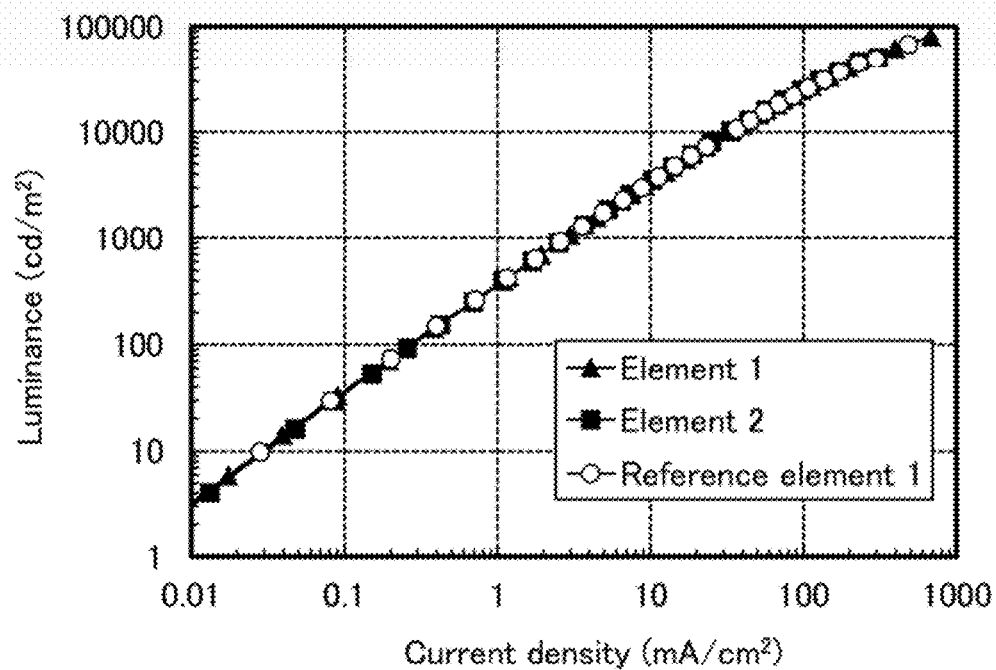
FIG. 13 shows current density-luminance characteristics of a light-emitting element 1 (element 1), a light-emitting element 2 (element 2), and a comparative light-emitting element 1 (reference element 1).
Figure 14:
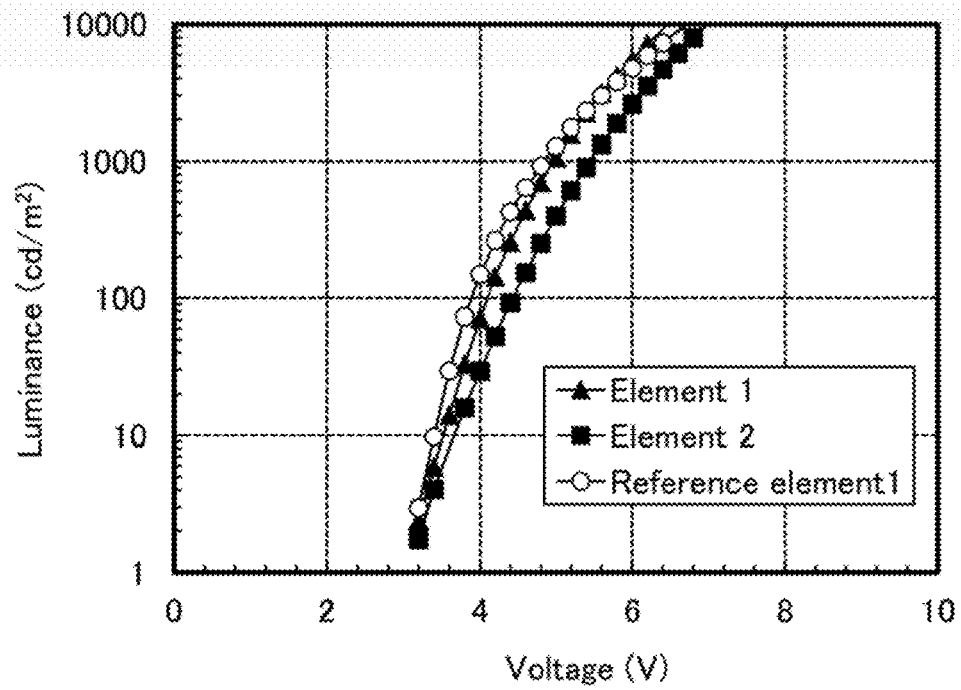
FIG. 14 shows voltage-luminance characteristics of a light-emitting element 1, a light-emitting element 2, and a comparative light-emitting element 1.
Figure 15:
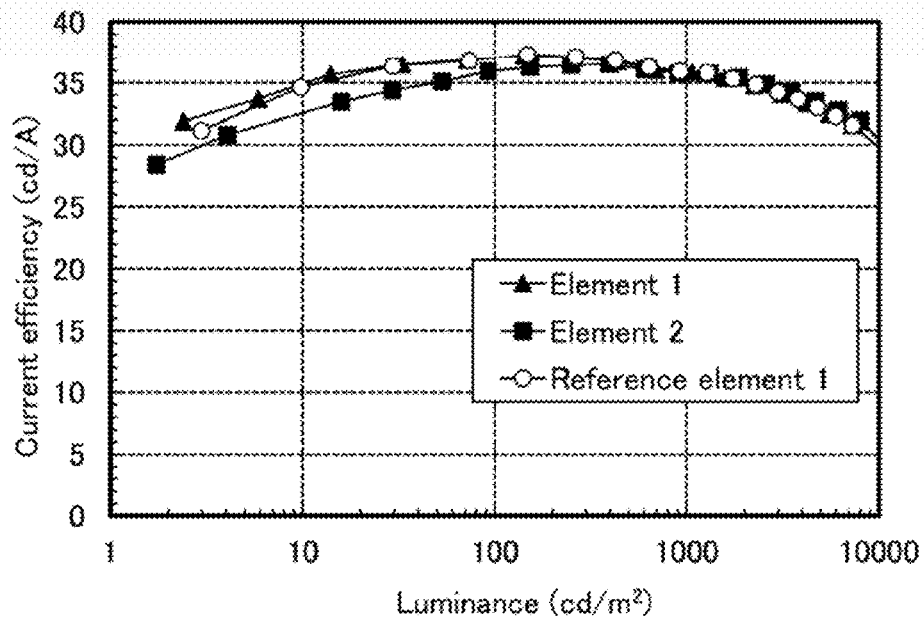
FIG. 15 shows luminance-current efficiency characteristics of a light-emitting element 1, a light-emitting element 2, and a comparative light-emitting element 1.
Figure 16:
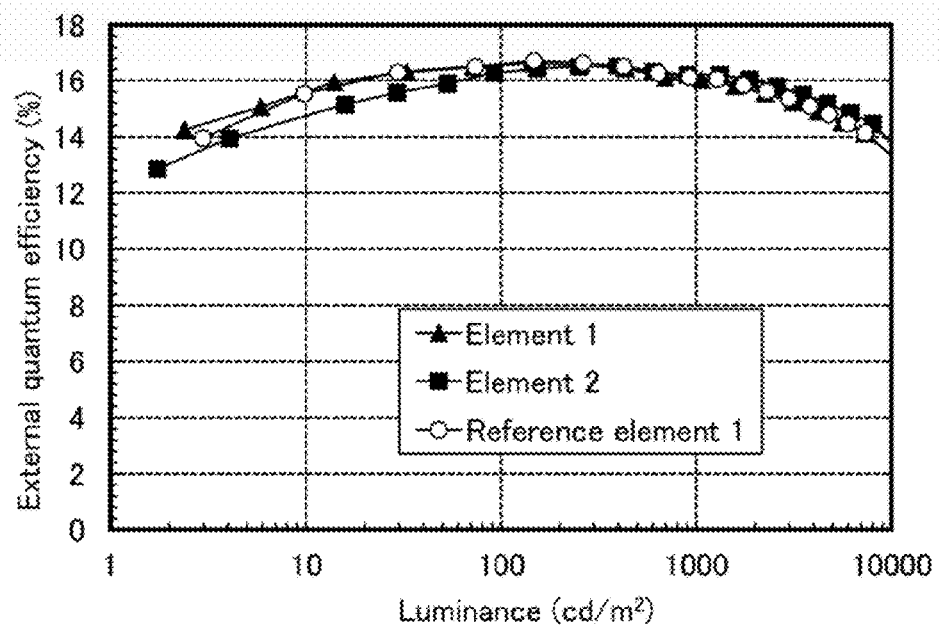
FIG. 16 shows luminance-external quantum efficiency characteristics of a light-emitting element 1, a light-emitting element 2, and a comparative light-emitting element 1.

FIG. 13 shows the current density-luminance characteristics of the light-emitting element 1, the light-emitting element 2, and the comparative light-emitting element 1; FIG. 14 shows the voltage-luminance characteristics thereof; FIG. 15 shows the luminance-current efficiency characteristics thereof, and FIG. 16 shows the luminance-external quantum efficiency characteristics thereof.

FIG. 15 shows that the light-emitting element 1, the light-emitting element 2, and the comparative light-emitting element 1 each have favorable luminance-current efficiency characteristics and thus have high emission efficiency. Moreover, FIG. 14 shows that the light-emitting element 1, the light-emitting element 2, and the comparative light-emitting element 1 each have favorable voltage-luminance characteristics and thus have low drive voltage. FIG. 13 and FIG. 16 also show that the light-emitting element 1, the light-emitting element 2, and the comparative light-emitting element 1 each have favorable current density-luminance characteristics and favorable luminance-external quantum efficiency characteristics. The above results show that each of the light-emitting element 1, the light-emitting element 2, and the comparative light-emitting element 1 has favorable initial characteristics.

Figure 17:
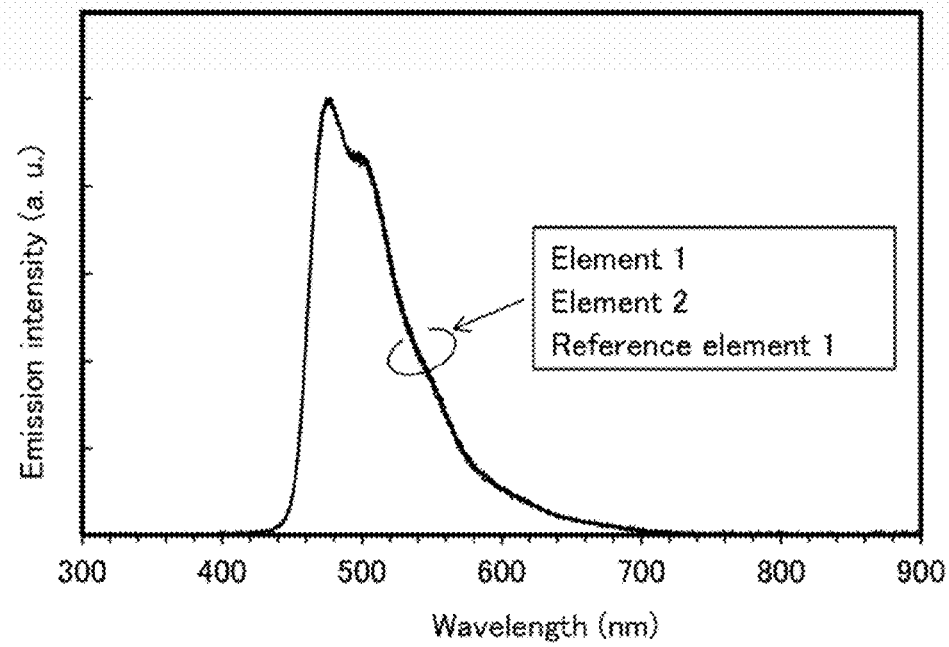
FIG. 17 shows emission spectra of a light-emitting element 1, a light-emitting element 2, and a comparative light-emitting element 1.

FIG. 17 shows normalized emission spectra at the time when a current was made to flow in the fabricated light-emitting elements at a current density of 2.5 mA/cm². FIG. 17 shows that the light-emitting element 1, the light-emitting element 2, and the comparative light-emitting element 1 each emit blue light originating from Ir(mpptz-dmp)₃, which is a light-emitting substance.

Figure 18:
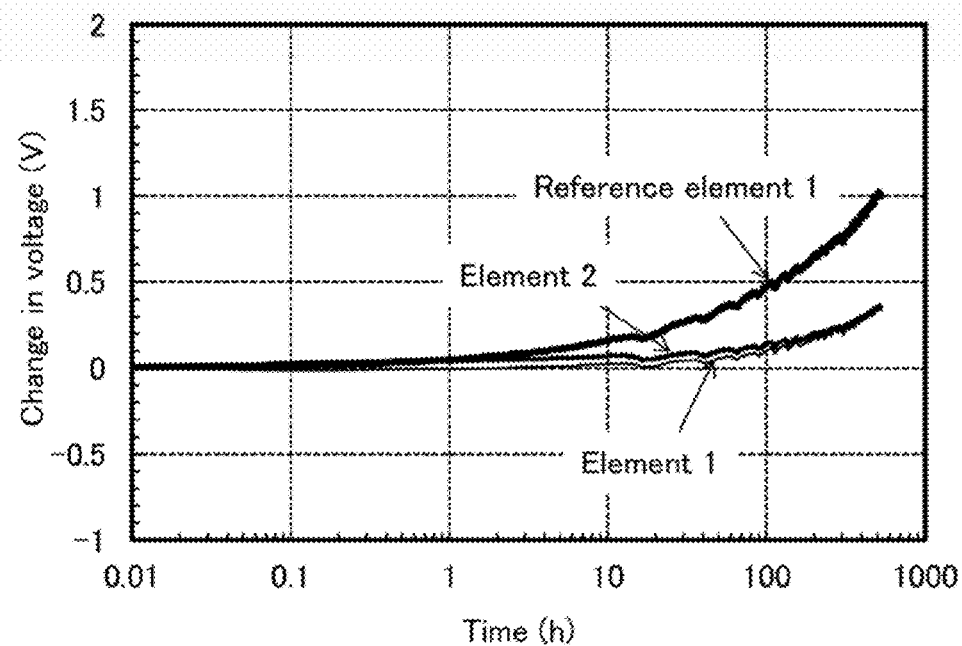
FIG. 18 shows changes in drive voltage of a light-emitting element 1, a light-emitting element 2, and a comparative light-emitting element 1.

FIG. 18 shows the results of reliability tests in which the light-emitting element 1, the light-emitting element 2, and the comparative light-emitting element 1 were driven under conditions where the initial luminance was 1000 cd/m² and the current density was constant. FIG. 18 shows changes in voltage from the initial voltage. The results show that a voltage increase over driving time of each of the light-emitting element 1 and the light-emitting element 2 is small, and the light-emitting element 1 and the light-emitting element 2 each have high reliability.

In the comparative light-emitting element 1, the material of the electron-transport layer 114 is the same as the host material. Accordingly, it can be presumed that there is substantially no barrier against electron injection from the electron-transport layer 114 to the light-emitting layer 113; however, a significantly large increase in voltage was caused during driving, meaning that the comparative light-emitting element 1 much more deteriorates (i.e., the comparative light-emitting element 1 has a much larger drive voltage increase) than the light-emitting element 1 and the light-emitting element 2.

Example 2

In this example, the light-emitting element described in Embodiment 1 (a light-emitting element 3 (element 3)) will be described. The light-emitting element in this example includes a blue-emissive phosphorescent substance. In this example, a host material different from those of the light-emitting elements described in Example 1 was used.

Molecular structures of organic compounds that were used in this example are shown by Structural Formulae (i), (ii), (iv) to (vi), and (viii). The element structure in FIG. 1 was employed.

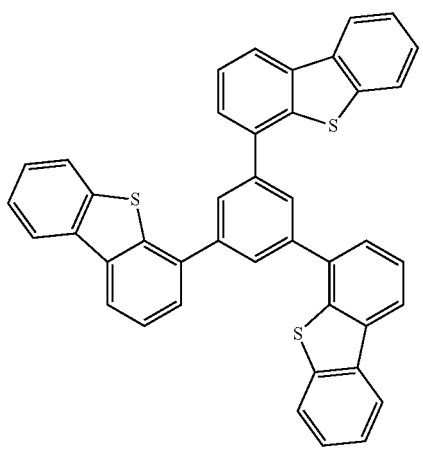

DBT3P-II
(i)

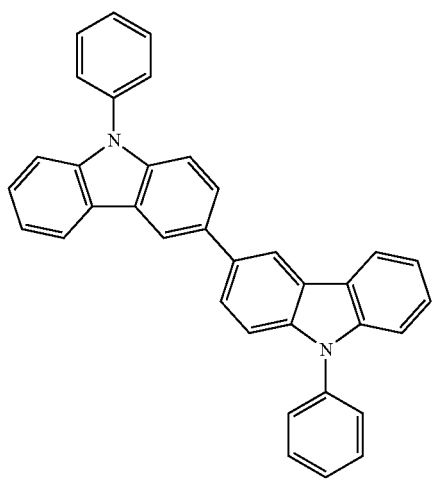

PCCP
(ii)

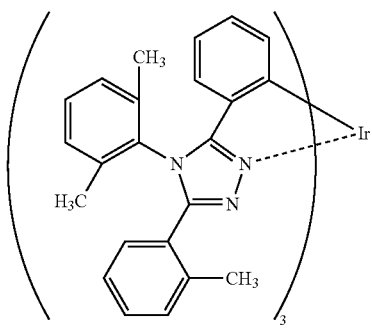

Ir(mpptz-dmp)₃
(iv)

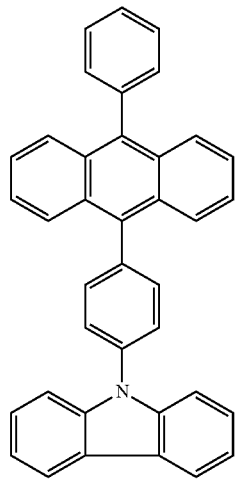

CzPA
(v)

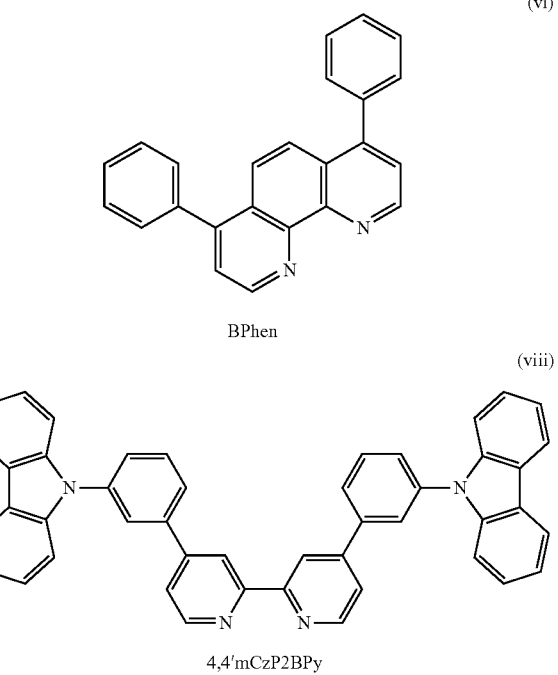

BPhen (vi)

4,4'mCzP2BPy (viii)

<<Fabrication of Light-Emitting Element 3>>

First, a glass substrate, over which a film of indium tin oxide containing silicon (ITSO) was formed to a thickness of 110 nm as the anode 101, was prepared. A surface of the ITSO film was covered with a polyimide film so that an area of 2 mm×2 mm of the surface was exposed. The electrode area was 2 mm×2 mm. As pretreatment for forming the light-emitting element over the substrate, the surface of the substrate was washed with water and baked at 200° C. for 1 hour, and then UV-ozone treatment was performed for 370 seconds. After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate was fixed to a holder provided in the vacuum evaporation apparatus so that the surface provided with ITSO faced downward.

The pressure in the vacuum evaporation apparatus was reduced to $10^{-4}$ Pa. Then, DBT3P-II (Structural Formula (i)) and molybdenum(VI) oxide were deposited by co-evaporation so that DBT3P-II:molybdenum oxide=4:2 (weight ratio), whereby the hole-injection layer 111 was formed. The thickness was set to 60 nm.

Next, PCCP (Structural Formula (ii)) was deposited by evaporation to a thickness of 20 nm, whereby the hole-transport layer 112 was formed.

Then, PCCP, 4,4'-bis[(3-(9H-carbazol-9-yl)phenyl]-2,2'-bipyridine (abbreviation: 4,4'mCzP2BPy) represented by Structural Formula (viii), and [Ir(mpptz-dmp)₃] (Structural Formula (iv)) were deposited by co-evaporation to a thickness of 30 nm on the hole-transport layer 112 so that PCCP:4,4'mCzP2BPy:[Ir(mpptz-dmp)₃]=1:0.3:0.06 (weight ratio), and then, 4,4'mCzP2BPy and [Ir(mpptz-dmp)₃] were deposited by co-evaporation to a thickness of 10 nm so that 4,4'mCzP2BPy:[Ir(mpptz-dmp)₃]=1:0.06 (weight ratio), whereby the light-emitting layer 113 was formed.

Next, CzPA (Structural Formula (v)) was deposited by evaporation to a thickness of 20 nm, whereby the electron-transport layer 114 was formed.

Then, BPhen (Structural Formula (vi)) was deposited by evaporation to a thickness of 15 nm on the electron-transport layer 114.

Lithium fluoride was then deposited by evaporation to a thickness of 1 nm as an electron-injection buffer layer, whereby the electron-injection layer 115 was formed. Lastly, a film of aluminum was formed to a thickness of 200 nm as the cathode 102. Thus, the light-emitting element 3 was completed. Note that in all the above evaporation steps, evaporation was performed by a resistance-heating method.

<<Operation Characteristics of Light-Emitting Element 3>>

The light-emitting element 3 obtained as described above was sealed in a glove box containing a nitrogen atmosphere so as not to be exposed to the air (specifically, a sealant was applied onto an outer edge of the element, and heat treatment at 80° C. for 1 hour and UV treatment were performed at the time of sealing). Then, the operation characteristics of the light-emitting element were measured. Note that the measurement was carried out at room temperature (in an atmosphere kept at 25° C.).

Figure 19:
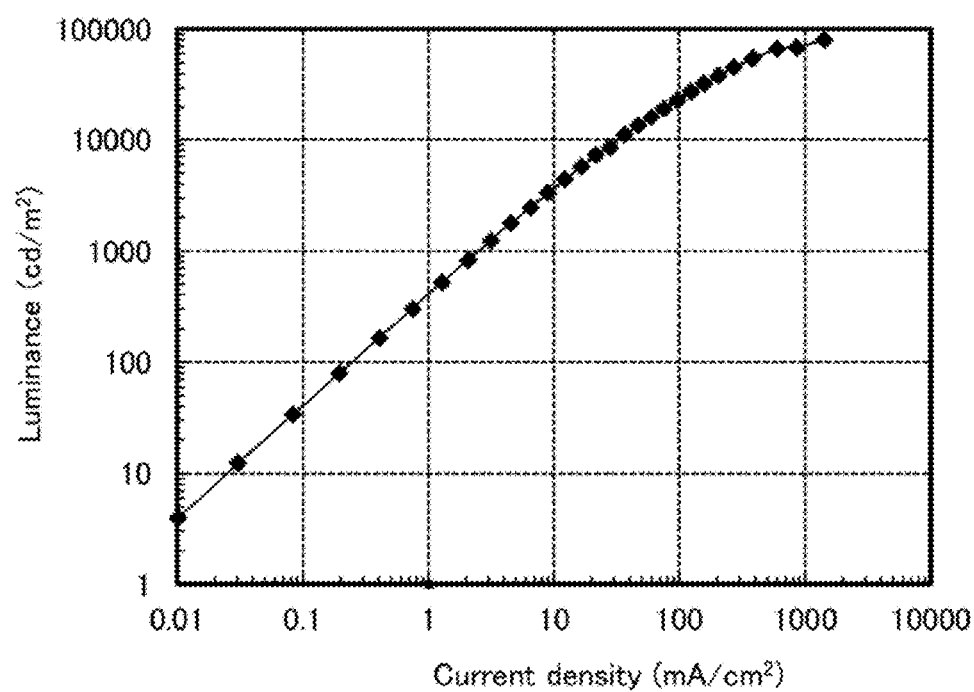
FIG. 19 shows current density-luminance characteristics of a light-emitting element 3 (element 3).
Figure 20:
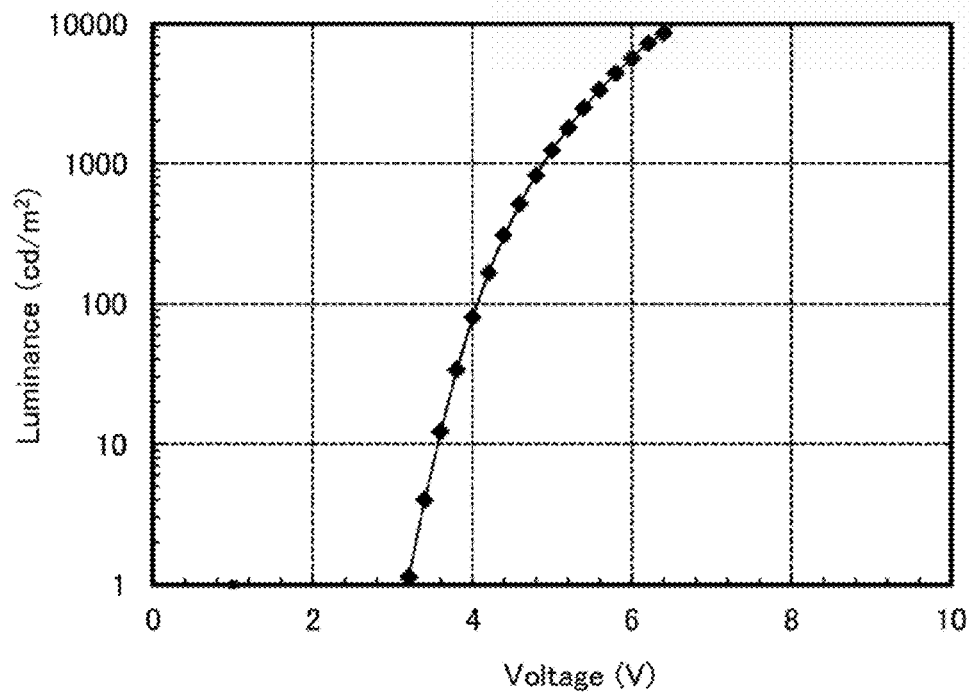
FIG. 20 shows voltage-luminance characteristics of a light-emitting element 3.
Figure 21:
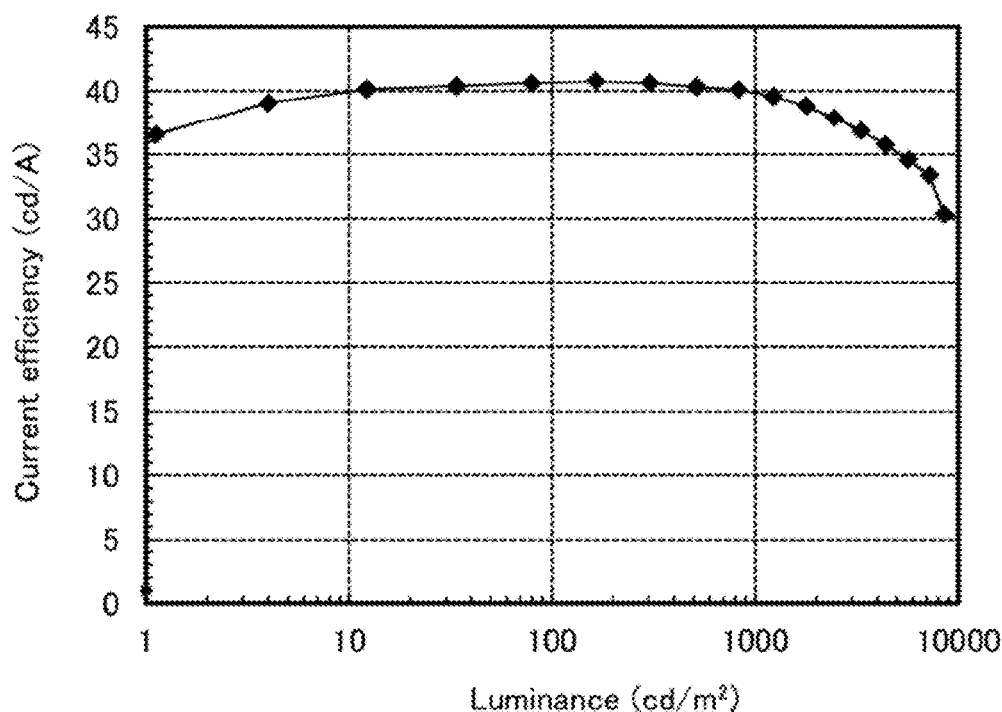
FIG. 21 shows luminance-current efficiency characteristics of a light-emitting element 3.
Figure 22:
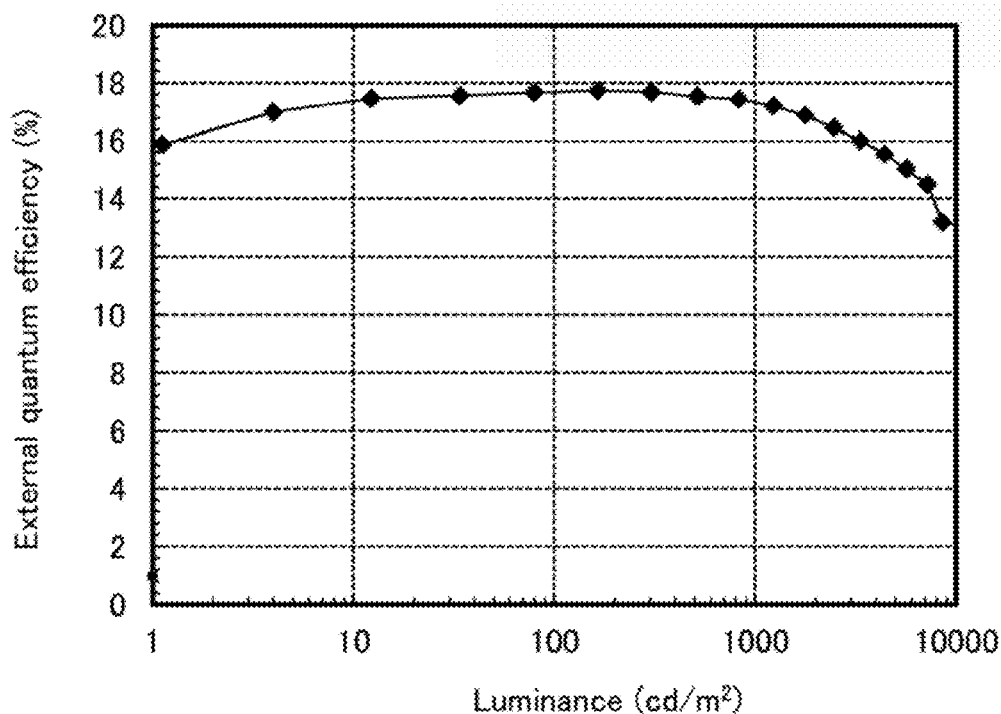
FIG. 22 shows luminance-external quantum efficiency characteristics of a light-emitting element 3.

FIG. 19 shows the current density-luminance characteristics of the light-emitting element 3; FIG. 20 shows the voltage-luminance characteristics thereof. FIG. 21 shows the luminance-current efficiency characteristics thereof; and FIG. 22 shows the luminance-external quantum efficiency characteristics thereof.

FIG. 21 shows that the light-emitting element 3 has favorable luminance-current efficiency characteristics and thus has high emission efficiency. Moreover, FIG. 20 shows that the light-emitting element 3 has favorable voltage-luminance characteristics. FIG. 19 and FIG. 22 also show that the light-emitting element 3 has favorable current density-luminance characteristics and favorable luminance-external quantum efficiency characteristics. The above results show that the light-emitting element 3 has favorable initial characteristics.

Figure 23:
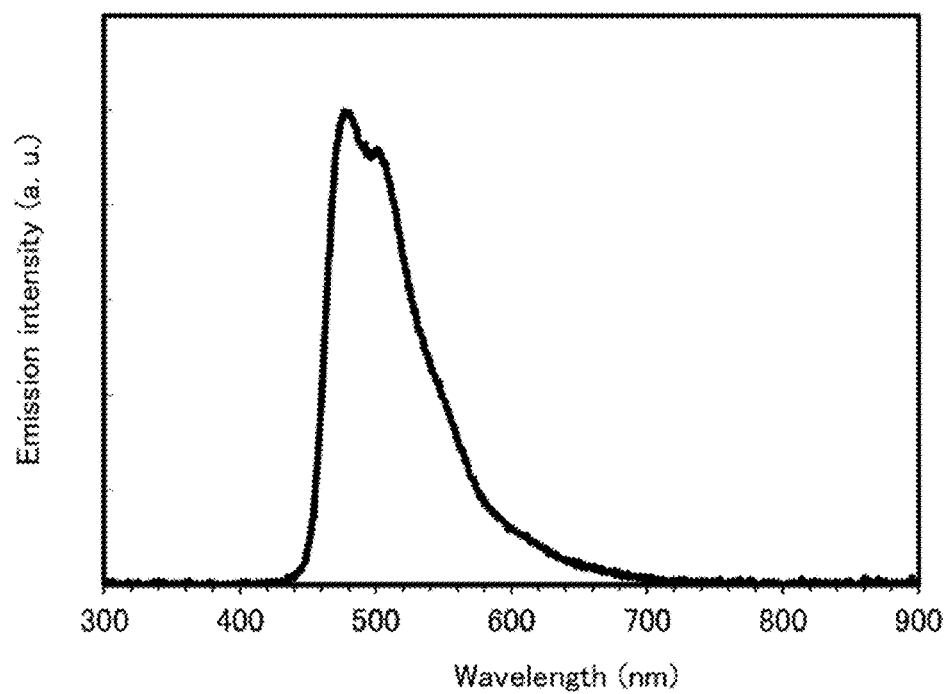
FIG. 23 shows an emission spectrum of a light-emitting element 3.

FIG. 23 shows a normalized emission spectrum at the time when a current was made to flow in the fabricated light-emitting element at a current density of 2.5 mA/cm². FIG. 23 shows that the light-emitting element 3 emits blue light originating from Ir(mppt-dmp)₃, which is a light-emitting substance.

Figure 24:
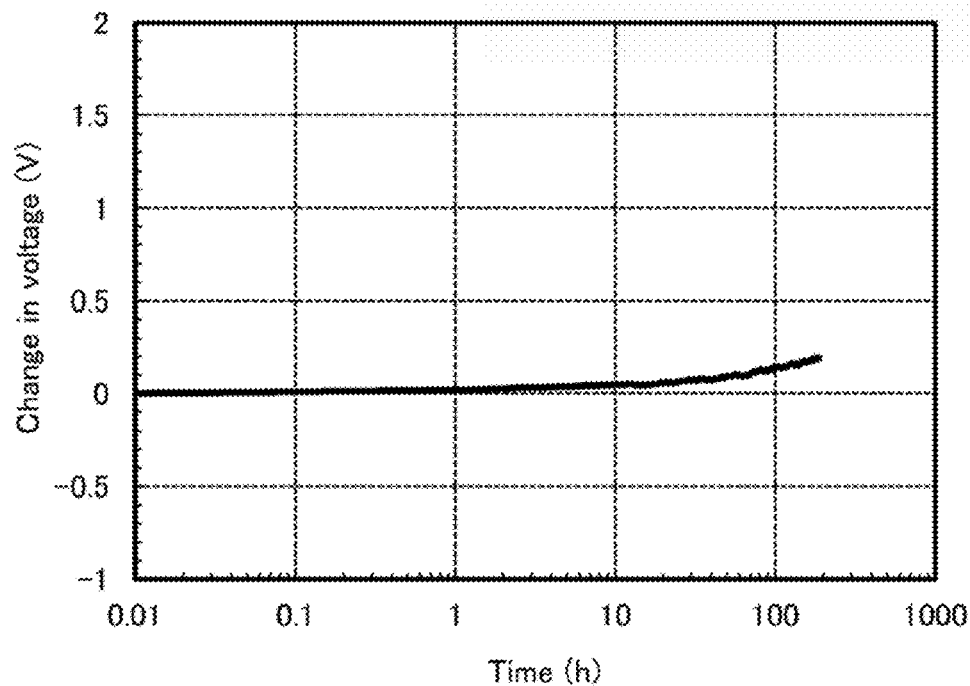
FIG. 24 shows a change in drive voltage of a light-emitting element 3.

FIG. 24 shows the results of a reliability test in which the light-emitting element 3 was driven under conditions where the initial luminance was 1000 cd/m² and the current density was constant. FIG. 24 shows a change in voltage from the initial voltage. The results show that a voltage increase over driving time of the light-emitting element 3 is small, and thus the light-emitting element 3 has high reliability.

Example 3

In this example, the light-emitting element described in Embodiment 1 (a light-emitting element 4) will be described. The light-emitting element in this example includes a blue-emissive phosphorescent substance. In this example, a host material different from those of the light-emitting elements described in Example 1 and Example 2 was used.

Molecular structures of organic compounds that were used in this example are shown by Structural Formulae (i), (ii), (iv) to (vi), and (ix). The element structure in FIG. 1 was employed.

(i)

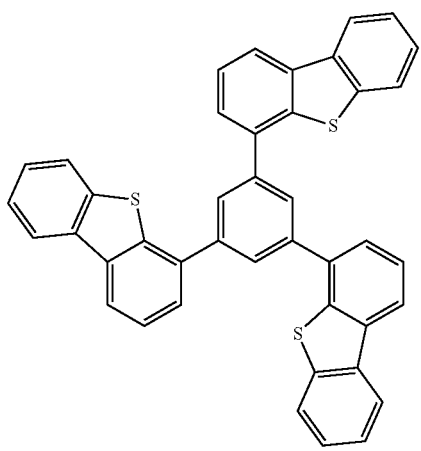

DBT3P-II (ii)

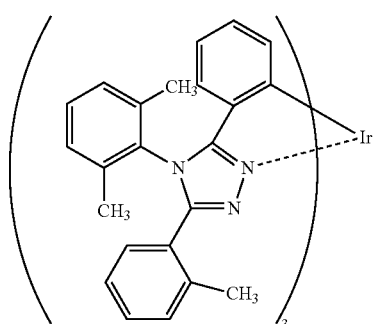

PCCP (iv)

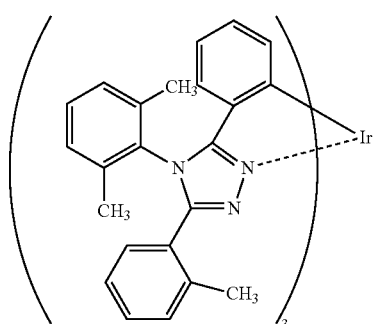

Ir(mpptz-dmp)₃

(v)

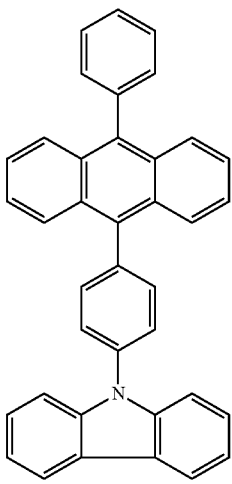

CzPA (vi)

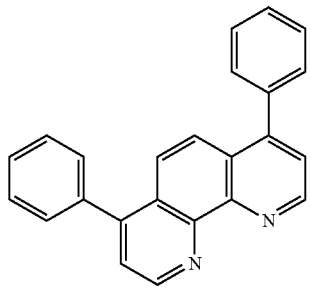

BPhen (ix)

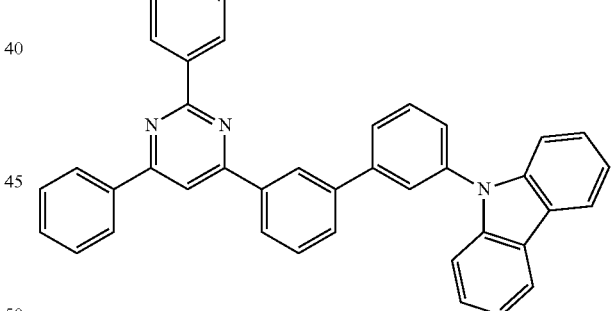

Pm-016

<<Fabrication of Light-Emitting Element 4>>

First, a glass substrate, over which a film of indium tin oxide containing silicon (ITSO) was formed to a thickness of 110 nm as the anode 101, was prepared. A surface of the ITSO film was covered with a polyimide film so that an area of 2 mm×2 mm of the surface was exposed. The electrode area was 2 mm×2 mm. As pretreatment for forming the light-emitting element over the substrate, the surface of the substrate was washed with water and baked at 200° C. for 1 hour, and then UV-ozone treatment was performed for 370 seconds. After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate was fixed to a holder provided in the vacuum evaporation apparatus so that the surface provided with ITSO faced downward.

The pressure in the vacuum evaporation apparatus was reduced to $10^{-4}$ Pa. Then, DBT3P-II (Structural Formula (i)) and molybdenum(VI) oxide were deposited by co-evaporation so that DBT3P-II:molybdenum oxide=4:2 (weight ratio), whereby the hole-injection layer 111 was formed. The thickness was set to 60 nm.

Next, PCCP (Structural Formula (ii)) was deposited by evaporation to a thickness of 20 nm, whereby the hole-transport layer 112 was formed.

Then, PCCP, 4-[3'-(9H-carbazol-9)-yl)biphenyl-3-yl]-2,6-diphenylpyrimidine (abbreviation: Pm-016) represented by Structural Formula (ix), and [Ir(mpptz-dmp)$_3$] (Structural Formula (iv)) were deposited by co-evaporation to a thickness of 30 nm on the hole-transport layer 112 so that PCCP:Pm-016:[Ir(mpptz-dmp)$_3$]=1:0.3:0.06 (weight ratio), and then, Pm-016 and [Ir(mpptz-dmp)$_3$] were deposited by co-evaporation to a thickness of 10 nm so that Pm-016:[Ir(mpptz-dmp)$_3$]=1:0.06 (weight ratio), whereby the light-emitting layer 113 was formed.

Next, CzPA (Structural Formula (v)) was deposited by evaporation to a thickness of 20 nm, whereby the electron-transport layer 114 was formed.

Then, BPhen (Structural Formula (vi)) was deposited by evaporation to a thickness of 15 nm on the electron-transport layer 114.

Lithium fluoride was then deposited by evaporation to a thickness of 1 nm as an electron-injection buffer layer, whereby the electron-injection layer 115 was formed. Lastly, a film of aluminum was formed to a thickness of 200 nm as the cathode 102. Thus, the light-emitting element 4 was completed. Note that in all the above evaporation steps, evaporation was performed by a resistance-heating method.
<<Operation Characteristics of Light-Emitting Element 4>>

The light-emitting element 4 obtained as described above was sealed in a glove box containing a nitrogen atmosphere so as not to be exposed to the air (specifically, a sealant was applied onto an outer edge of the element, and heat treatment at 80° C. for 1 hour and UV treatment were performed at the time of sealing). Then, the operation characteristics of the light-emitting element were measured. Note that the measurement was carried out at room temperature (in an atmosphere kept at 25° C.).

Figure 25:
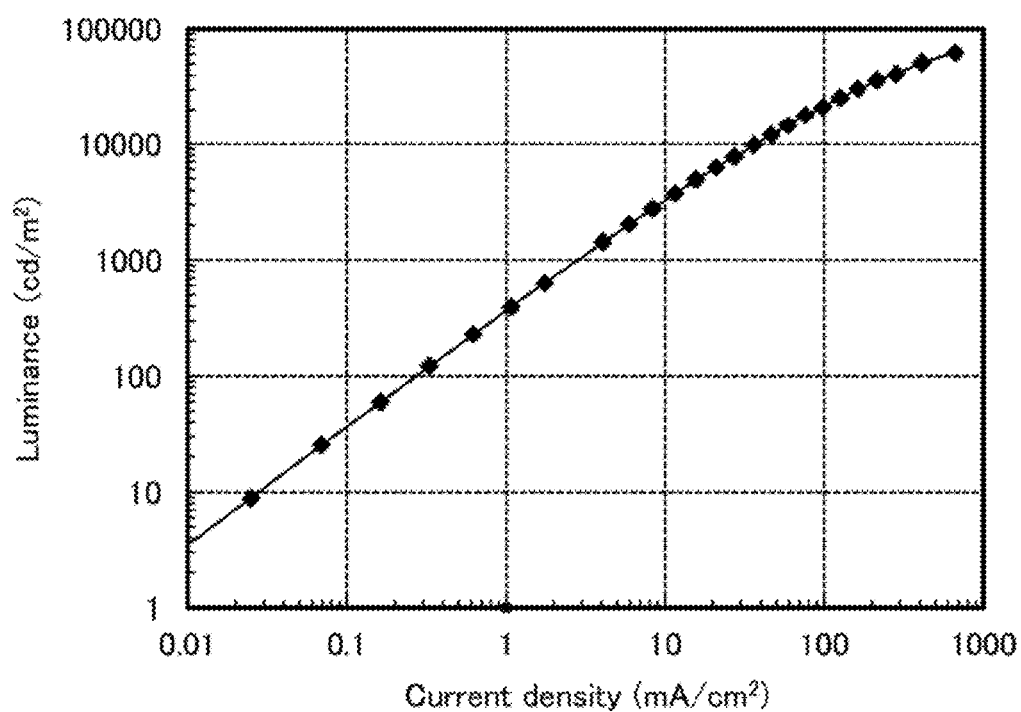
FIG. 25 shows current density-luminance characteristics of a light-emitting element 4 (element 4).
Figure 26:
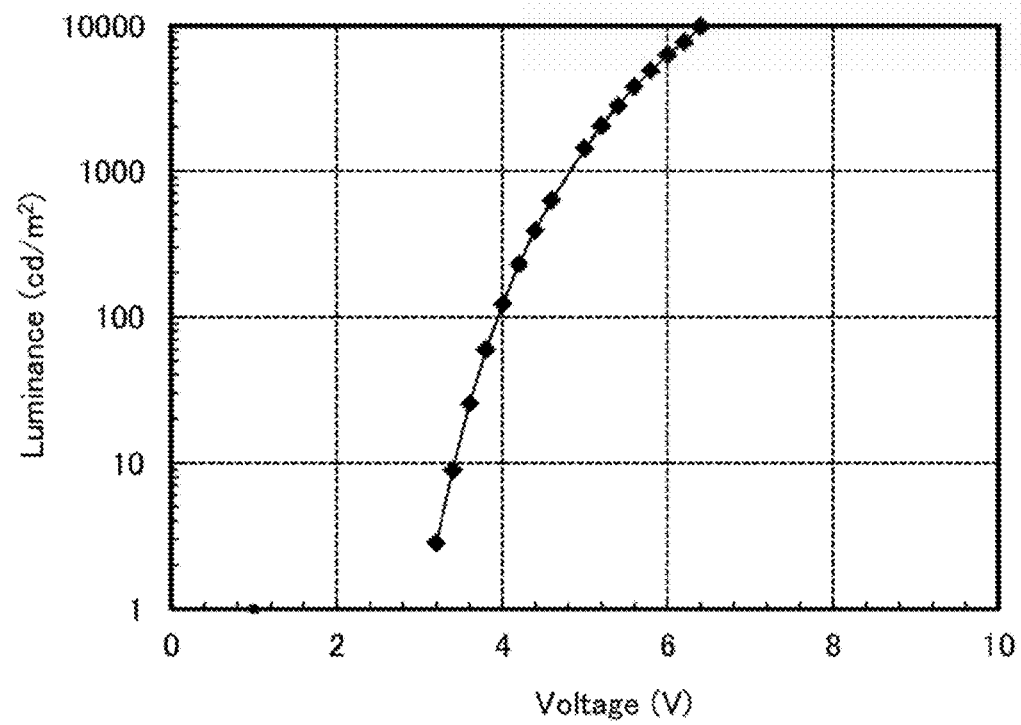
FIG. 26 shows voltage-luminance characteristics of a light-emitting element 4.
Figure 27:
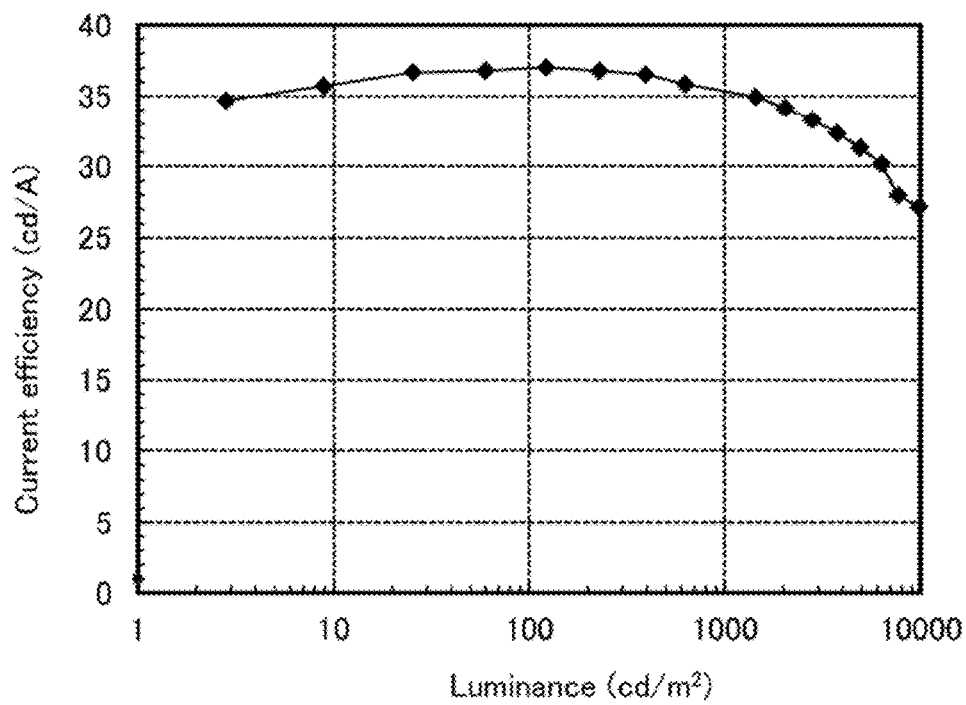
FIG. 27 shows luminance-current efficiency characteristics of a light-emitting element 4.
Figure 28:
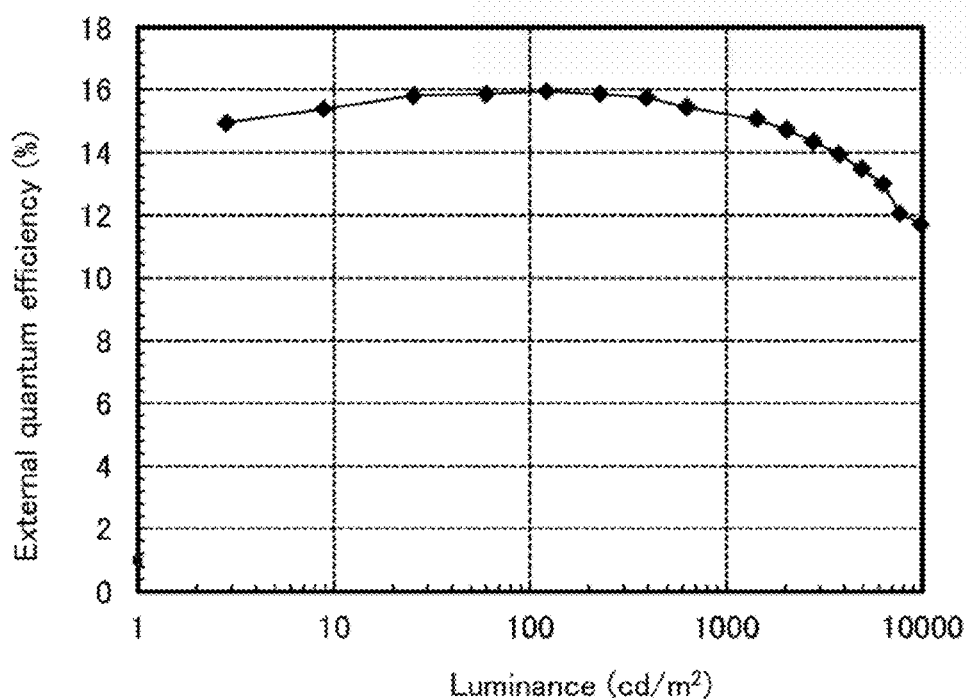
FIG. 28 shows luminance-external quantum efficiency characteristics of a light-emitting element 4.

FIG. 25 shows the current density-luminance characteristics of the light-emitting element 4; FIG. 26 shows the voltage-luminance characteristics thereof; FIG. 27 shows the luminance-current efficiency characteristics thereof; and FIG. 28 shows the luminance-external quantum efficiency characteristics thereof.

FIG. 27 shows that the light-emitting element 4 has favorable luminance-current efficiency characteristics and thus has high emission efficiency. Moreover, FIG. 26 shows that the light-emitting element 4 has favorable voltage-luminance characteristics. FIG. 25 and FIG. 28 also show that the light-emitting element 4 has favorable current density-luminance characteristics and favorable luminance-external quantum efficiency characteristics. The above results show that the light-emitting element 4 has favorable initial characteristics.

Figure 29:
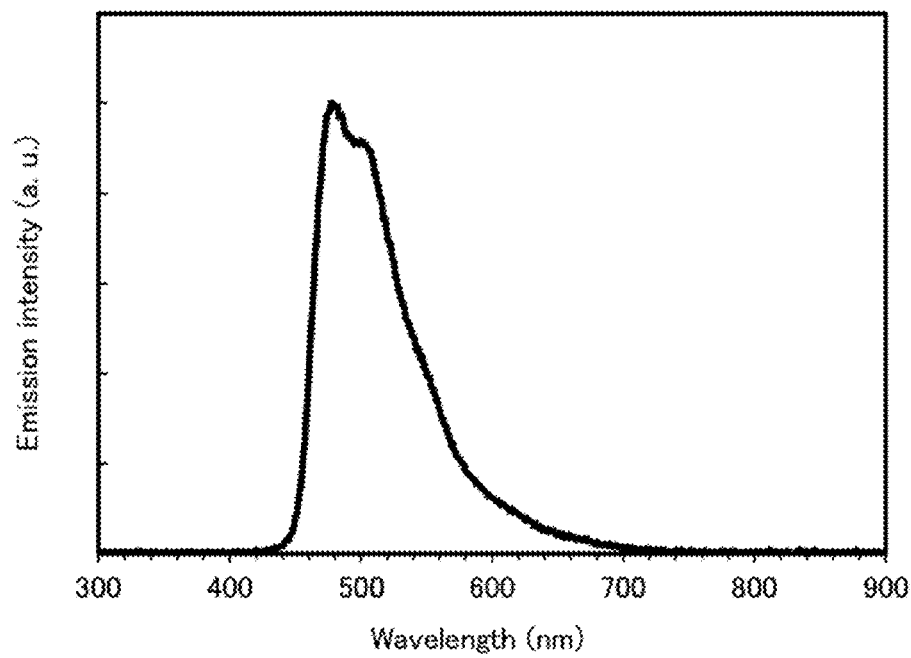
FIG. 29 shows an emission spectrum of a light-emitting element 4.

FIG. 29 shows a normalized emission spectrum at the time when a current was made to flow in the fabricated light-emitting element at a current density of 2.5 mA/cm$^2$. FIG. 29 shows that the light-emitting element 4 emits blue light originating from Ir(mpptz-dmp)$_3$, which is a light-emitting substance.

Figure 30:
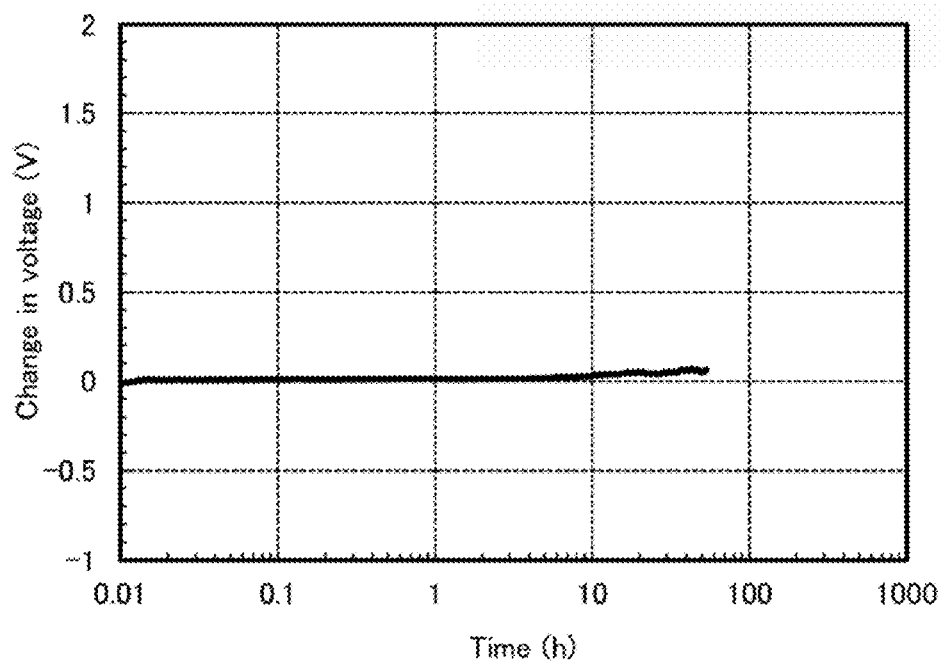
FIG. 30 shows a change in drive voltage of a light-emitting element 4.

FIG. 30 shows the results of a reliability test in which the light-emitting element 4 was driven under conditions where the initial luminance was 1000 cd/m$^2$ and the current density was constant. FIG. 30 shows a change in voltage from the initial voltage. The results show that a voltage increase over driving time of the light-emitting element 4 is small, and thus the light-emitting element 4 has high reliability.

Example 4

In this example, the light-emitting element described in Embodiment 1 (a light-emitting element 5 (element 5)) will be described. The light-emitting element in this example includes a blue-emissive phosphorescent substance. The light-emitting element in this example is different from the light-emitting elements described in Example 1 in that it has a multi-layer light-emitting layer emitting light of a plurality of colors. A comparative light-emitting element 2 (reference element 2) which has a structure similar to that of the light-emitting element 5 and in which a material of an electron-transport layer is a substance without an anthracene skeleton was also fabricated and the characteristics of the light-emitting elements were compared.

Molecular structures of organic compounds that were used in this example are shown by Structural Formulae (i) to (vi) and (x) to (xiii) below. The element structure in FIG. 1 was employed.

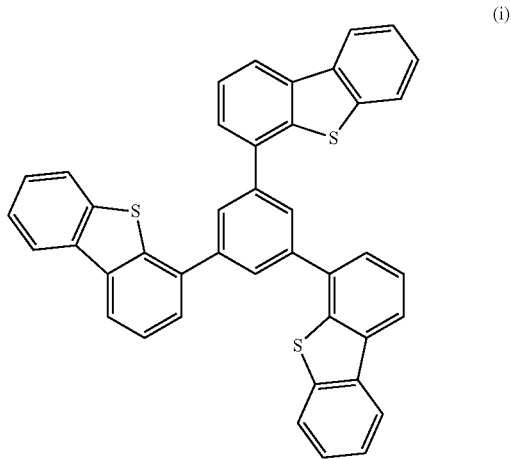

(i)

DBT3P-II

-continued
(ii)
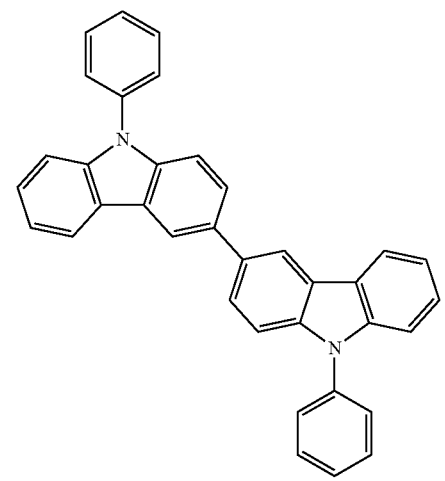
PCCP
(iii)
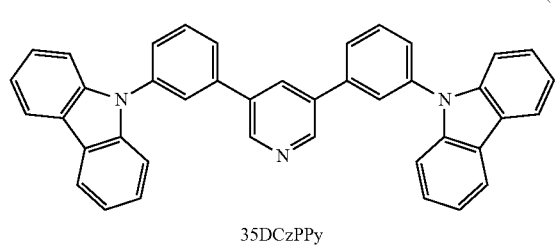
35DCzPPy
(iv)
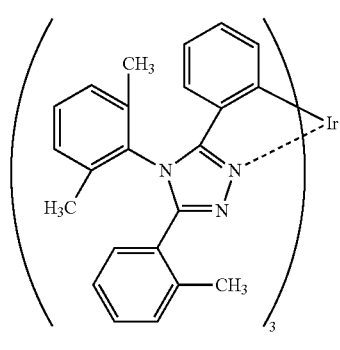
Ir(mpptz-dmp)₃
(v)
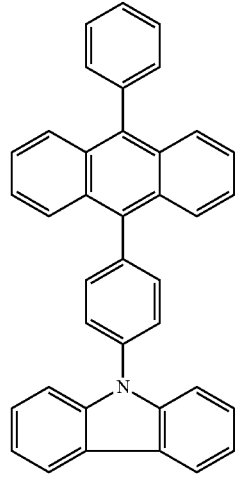
CzPA
-continued
(vi)
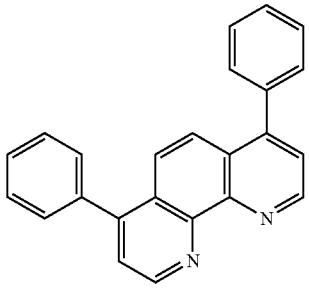
BPhen
(x)
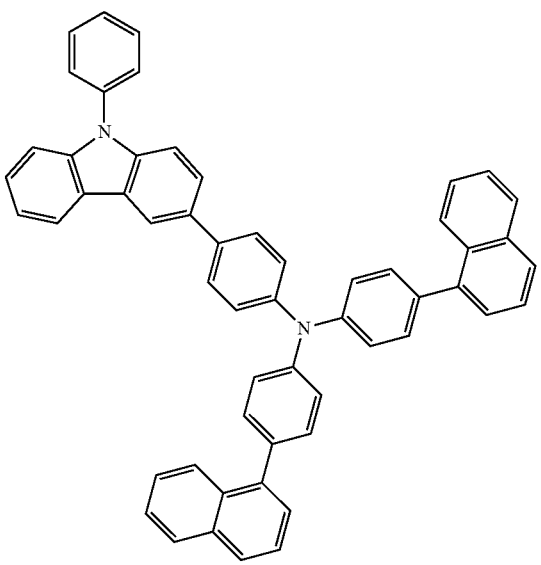
PCBNBB
(xi)
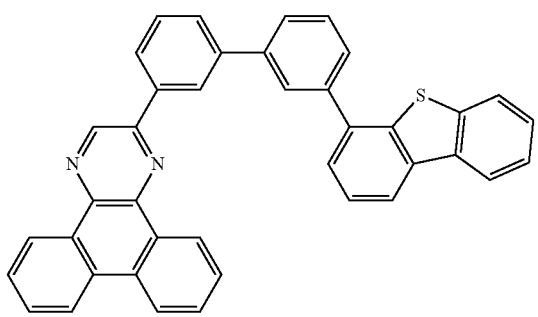
2mDBTBPDBq-II
(xii)
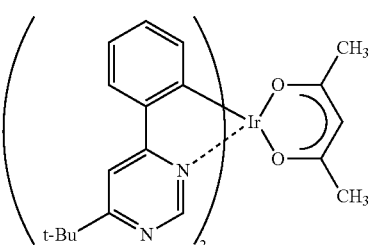
[Ir(tBuppm)₂(acac)]

-continued

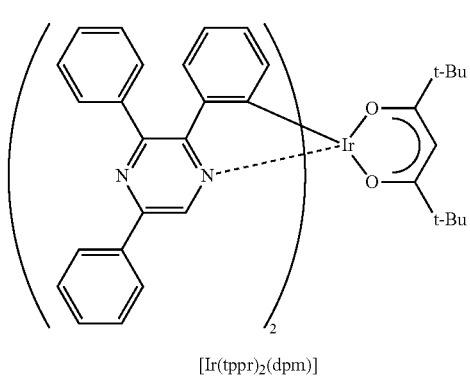

[Ir(tppr)₂(dpm)]

<<Fabrication of Light-Emitting Element 5>>

First, a glass substrate, over which a film of indium tin oxide containing silicon (ITSO) was formed to a thickness of 110 nm as the anode 101, was prepared. A surface of the ITSO film was covered with a polyimide film so that an area of 2 mm×2 mm of the surface was exposed. The electrode area was 2 mm×2 mm. As pretreatment for forming the light-emitting element over the substrate, the surface of the substrate was washed with water and baked at 200° C. for 1 hour, and then UV-ozone treatment was performed for 370 seconds. After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate was fixed to a holder provided in the vacuum evaporation apparatus so that the surface provided with ITSO faced downward.

The pressure in the vacuum evaporation apparatus was reduced to $10^{-4}$ Pa. Then, DBT3P-II (Structural Formula (i)) and molybdenum(VI) oxide were deposited by co-evaporation so that DBT3P-II:molybdenun oxide=4:2 (weight ratio), whereby the hole-injection layer 111 was formed. The thickness was set to 60 nm.

Next, 4,4'-di(1-naphthyl)-4"-(9-phenyl-9H-carbazol-3-yl) triphenylamine (abbreviation: PCBNBB) represented by Structural Formula (x) was deposited by evaporation to a thickness of 20 nm, whereby the hole-transport layer 112 was formed.

Then, the light-emitting layer 113 was formed on the hole-transport layer 112 in the following manner: 2-[3'-(dibenzothiophen-4-yl)biphenyl-3-yl]dibenzo[f,h]quinoxaline (abbreviation: 2mDBTBPDBq-II) represented by Structural Formula (xi), PCBNBB, and bis[2-(6-tert-butyl-4-pyrimidinyl-κN3)phenyl-κC](2,4-pentanedionato-κ²O,O) iridium(III) (abbreviation: [Ir(tBuppm)₂(acac)]) represented by Structural Formula (xii) were deposited by co-evaporation to a thickness of 20 nm so that 2mDBTBPDBq-II:PCBNBB:[Ir(tBuppm)₂(acac)]=0.8:0.2:0.05 (weight ratio); 2mDBTBPDBq-II, PCBNBB, and (dipivaloylmethanato)bis(2,3,5-triphenylpyrazinato)iridium(II) (abbreviation: [Ir(tppr)₂(dpm)]) represented by Structural Formula (xiii) were deposited by co-evaporation to a thickness of 5 nm so that 2mDBTBPDBq-II:PCBNBB:[Ir(tppr)₂(dpm)]=0.8:0.8:0.2:0.05 (weight ratio); and 35DCzPPy (Structural Formula (iii)), PCCP (Structural Formula (ii)), and [Ir(mpptz-dmp)₃](Structural Formula (iv)) were deposited by co-evaporation to a thickness of 30 nm so that 35DCzPPy:PCCP:[Ir(mpptz-dmp)₃]=0.7:0.3:0.06 (weight ratio).

Next, CzPA (Structural Formula (v)) was deposited by evaporation to a thickness of 10 nm, whereby the electron-transport layer 114 was formed.

Then, BPhen (Structural Formula (vi)) was deposited by evaporation to a thickness of 20 nm on the electron-transport layer 114.

Lithium fluoride was then deposited by evaporation to a thickness of I am as an electron-injection butter layer, whereby the electron-injection layer 115 was formed. Lastly, a film of aluminum was formed to a thickness of 200 nm as the cathode 102. Thus, the light-emitting element 5 was completed. Note that in all the above evaporation steps, evaporation was performed by a resistance-heating method.

<<Method for Fabricating Comparative Light-Emitting Element 2>>

The comparative light-emitting element 2 was formed in the same manner as the light-emitting element 5 except that the light-emitting layer and the electron-transport layer were formed in the following manners. The light-emitting layer was formed on the hole-transport layer 112 as follows: 2mDBTBPDBq-II (Structural Formula (xi)), PCBNBB, and [Ir(tBuppm)₂(acac)]) (Structural Formula (xii)) were deposited by co-evaporation to a thickness of 20 am so that 2mDBTBPDBq-II:PCBNBB:[Ir(tBuppm)₂(acac)]=0.7:0.3: 0.05 (weight ratio); 2mDBTBPDBq-II, PCBNBB, and [Ir(tppr)₂(dpm)]) (Structural Formula (xiii)) were deposited by co-evaporation to a thickness of 5 nm so that 2mDBTBP-DBq-II:PCBNBB:[Ir(tppr)₂(dpm)]=0.8:0.2:0.05 (weight ratio); and 35DCzPPy (Structural Formula (iii)), PCCP (Structural Formula (ii)), and [Ir(mpptz-dmp)₃](Structural Formula (iv)) were deposited by co-evaporation to a thickness of 30 nm so that 35DCzPPy:PCCP:[Ir(mpptz-dmp)₃]=0.3:0.7:0.06 (weight ratio). The electron-transport layer 115 was formed by depositing 35DCzPPy by evaporation to a thickness of 10 nm.

<<Operation Characteristics of Light-Emitting Element 5 and Comparative Light-Emitting Element 2>>

The light-emitting element 5 and the comparative light-emitting element 2 obtained as described above were sealed in a glove box containing a nitrogen atmosphere so as not to be exposed to the air (specifically, a sealant was applied onto an outer edge of each element, and heat treatment at 80° C. for 1 hour and UV treatment were performed at the time of sealing). Then, the operation characteristics of the light-emitting elements were measured. Note that the measurements were carried out at room temperature (in an atmosphere kept at 25° C.).

Figure 31:
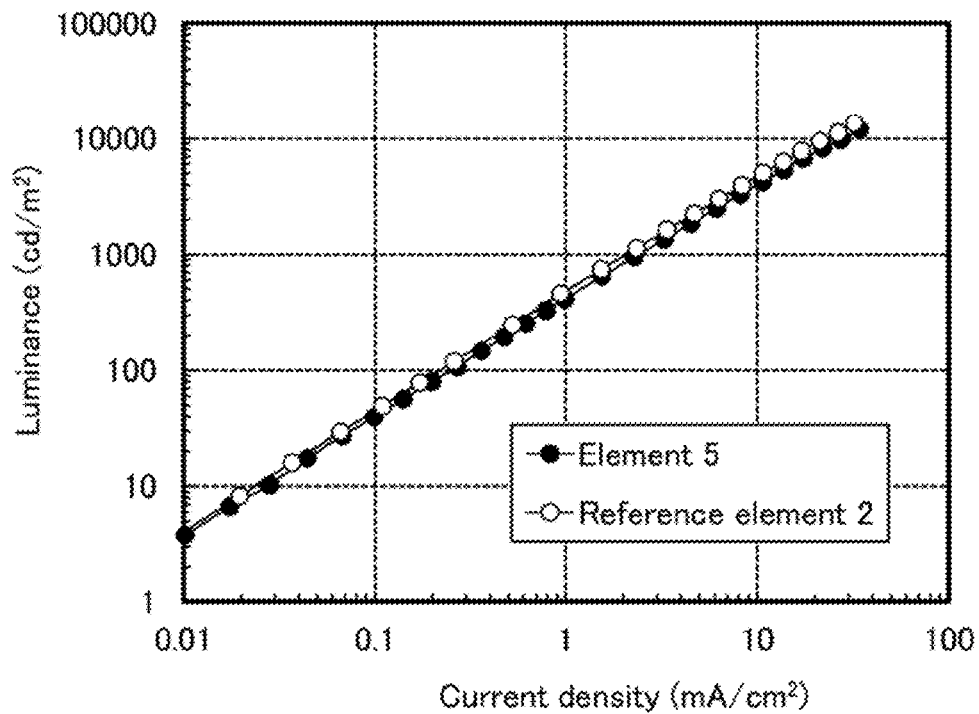
FIG. 31 shows current density-luminance characteristics of a light-emitting element 5 (element 5) and a comparative light-emitting element 2 (reference element 2).
Figure 32:
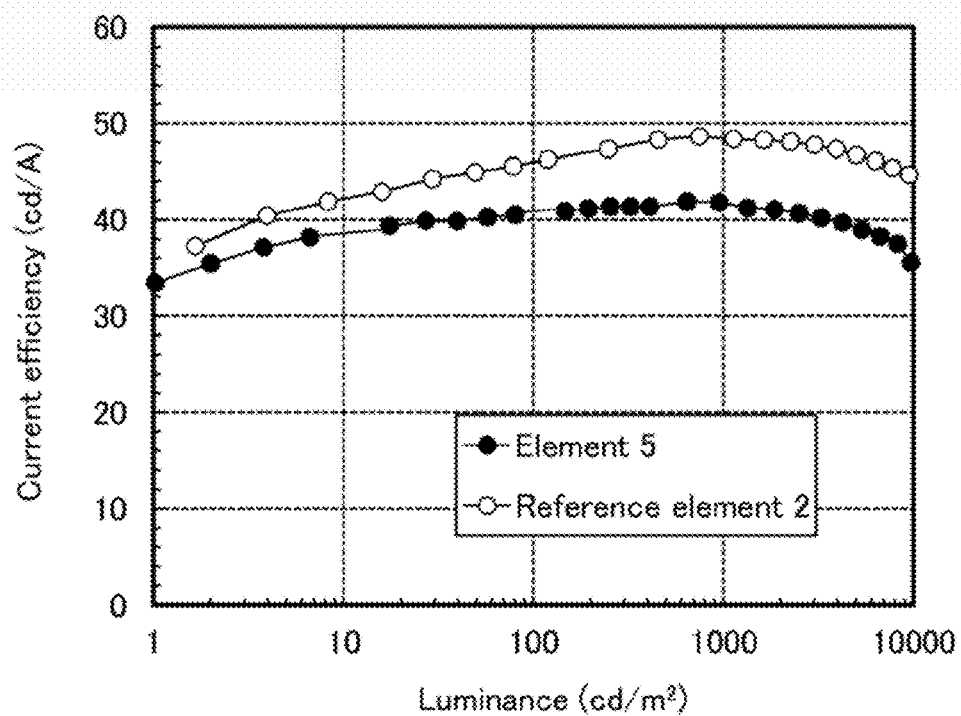
FIG. 32 shows luminance-current efficiency characteristics of a light-emitting element 5 and a comparative light-emitting element 2.
Figure 33:
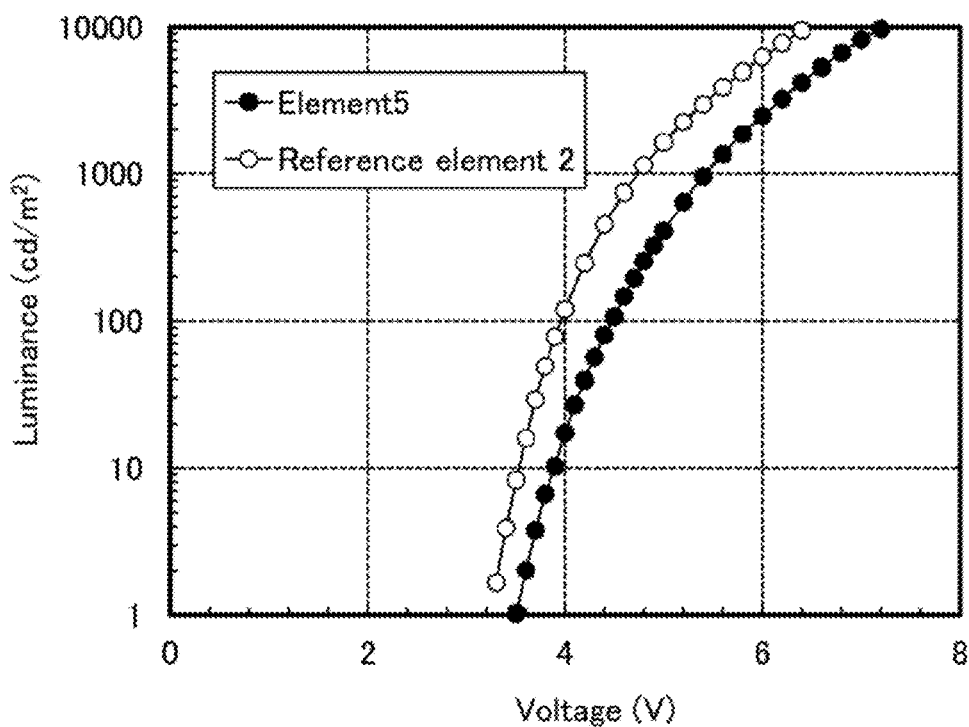
FIG. 33 shows voltage-luminance characteristics of a light-emitting element 5 and a comparative light-emitting element 2.
Figure 34:
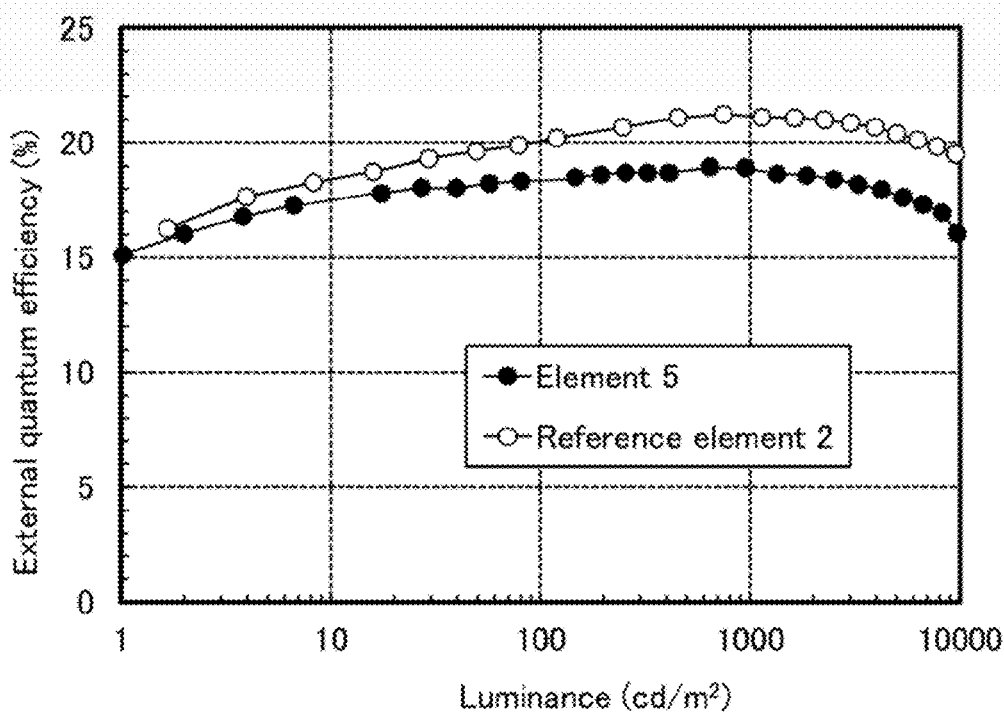
FIG. 34 shows luminance-external quantum efficiency characteristics of a light-emitting element 5 and a comparative light-emitting element 2.

FIG. 31 shows the current density-luminance characteristics of the light-emitting element 5 and the comparative light-emitting element 2; FIG. 32 shows the luminance-current efficiency characteristics thereof: FIG. 33 shows the voltage-luminance characteristics thereof; and FIG. 34 shows the luminance-external quantum efficiency characteristics thereof.

FIG. 33 shows that the light-emitting element 5 and the comparative light-emitting element 2 each have favorable luminance-current efficiency characteristics and thus have high emission efficiency. Moreover, FIG. 32 shows that the light-emitting element 5 and the comparative light-emitting element 2 each have favorable voltage-luminance characteristics. FIG. 31 and FIG. 34 also show that the light-emitting element 5 and the comparative light-emitting element 2 each have favorable current density-luminance characteristics and favorable luminance-external quantum efficiency characteristics. The above results show that each of the light-emitting element 5 and the comparative light-emitting element 2 has favorable initial characteristics.

Figure 35:
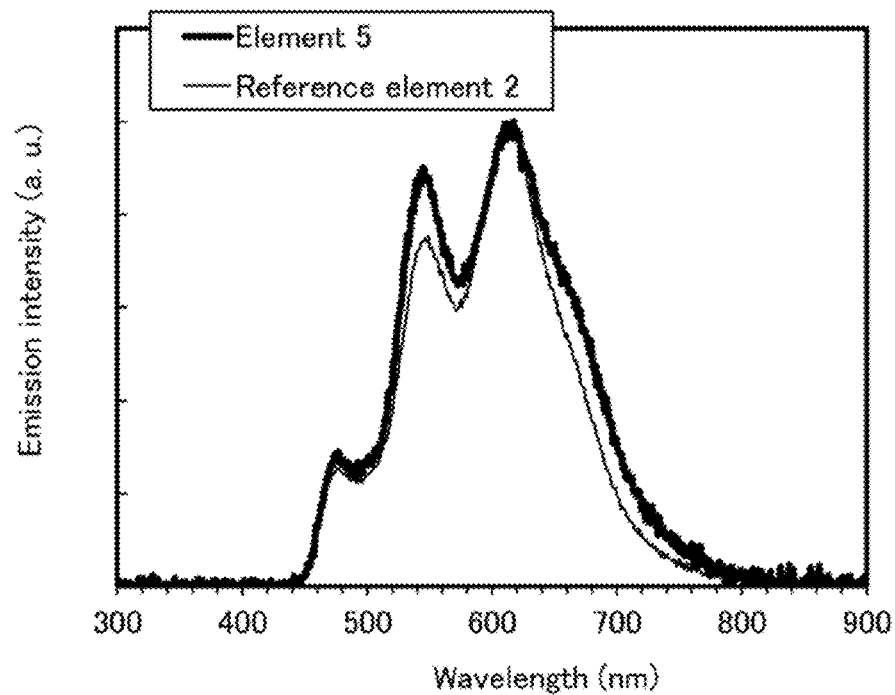
FIG. 35 shows emission spectra of a light-emitting element 5 and a comparative light-emitting element 2.

FIG. 35 shows normalized emission spectra at the time when a current was made to flow in the fabricated light-emitting elements at a current density of 2.5 mA/cm². FIG. 35 shows that the light-emitting element 5 and the comparative light-emitting element 2 each emit light originating from [Ir(tBuppm)Z(acac)], [Ir(tppr)₂(dpm)], and [Ir(mpptz-dmp)₃], which are light-emitting substances.

Figure 36:
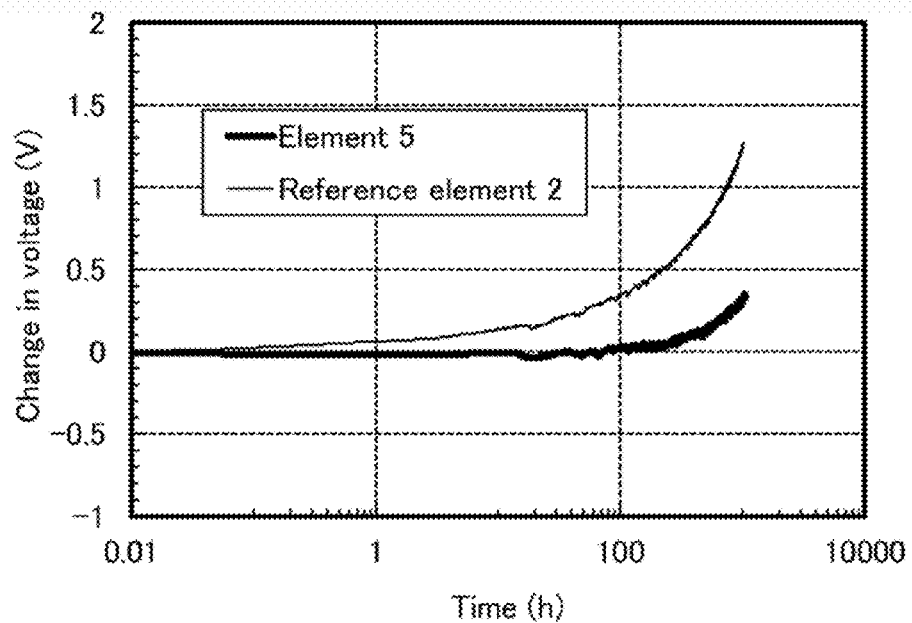
FIG. 36 shows a change in drive voltage of a light-emitting element 5 and a comparative light-emitting element 2.

FIG. 36 shows the results of reliability tests in which the light-emitting element 5 and the comparative light-emitting element 2 were driven under conditions where the initial luminance was 5000 cd/m² and the current density was constant. FIG. 36 shows changes in voltage from the initial voltage. The results show that a voltage increase over driving time of the light-emitting element 5 is much smaller than a voltage increase over driving time of the comparative light-emitting element 2, and thus the light-emitting element 5 has high reliability.

Figure 37:
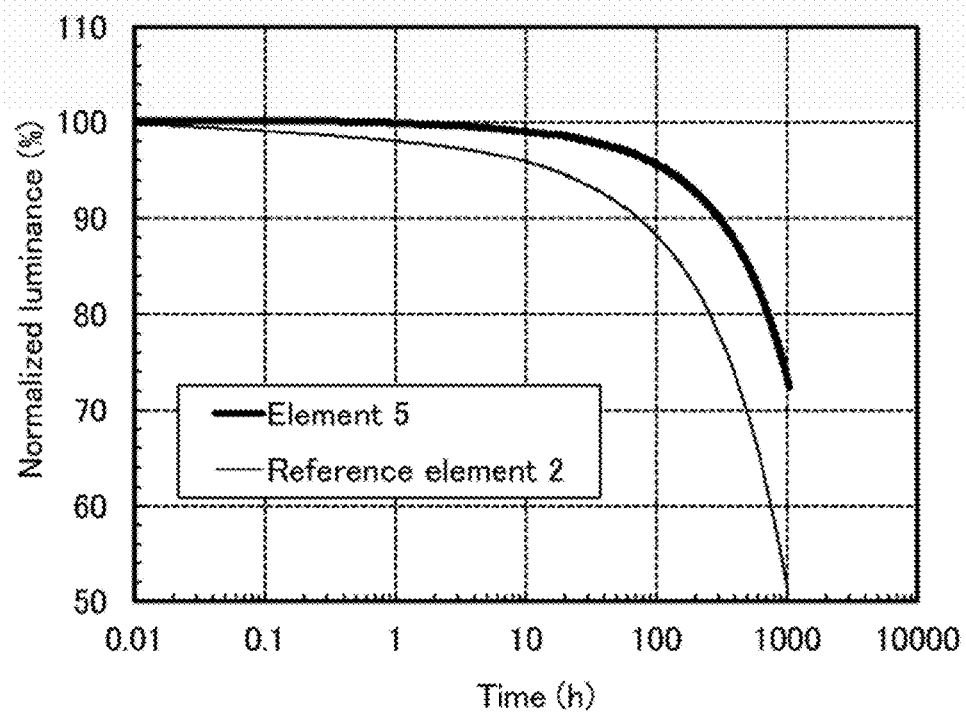
FIG. 37 shows time dependence of normalized luminance of a light-emitting element 5 and a comparative light-emitting element 2.

FIG. 37 shows results of measurements of changes in luminance in the case where the light-emitting element 5 and the comparative light-emitting element 2 were driven under conditions where the initial luminance was 5000 cd/m², which was normalized as 100%, and the current density was constant. As clear from FIG. 37, the light-emitting element 5 has a small change in normalized luminance with respect to time and thus has high reliability. The deterioration of the luminance of the comparative light-emitting element 2 occurred presumably because the interface between the electron-injection layer 115 and the electron-transport layer 114 deteriorates to reduce the injection amount of electrons, causing a shift of the recombination region (light-emitting region). In a light-emitting element like the light-emitting element 5 or the comparative light-emitting element 2, in which a plurality of light-emitting layers are stacked, a well-controlled carrier balance is extremely important in the light-emitting layers. Hence, a change in luminance with respect to time, what is called a lifetime, is greatly dependent on a change in the carrier balance. Because the light-emitting element 5 in this example includes the substance with an anthracene skeleton in the electron-transport layer 114, deterioration of the interface between the electron-injection layer 115 and the electron-transport layer 114 is inhibited, so that the shift of the light-emitting region accompanying a change in carrier balance can be prevented and thus, a luminance reduction can be very effectively suppressed.

This application is based on Japanese Patent Application serial no. 2013-104941 filed with Japan Patent Office on May 17, 2013, the entire contents of which are hereby incorporated by reference.

What is claimed is:

1. A light-emitting device comprising:
    an anode;
    a light-emitting layer over the anode, the light-emitting layer comprising a host material and a phosphorescent substance;
    an electron-transport layer over and in contact with the light-emitting layer, the electron-transport layer comprising a first organic compound which has an anthracene skeleton and one of a carbazolyl skeleton and a dibenzo[c,g]carbazolyl skeleton;
    an electron-injection layer over and in contact with the electron-transport layer, the electron-injection layer comprising a second organic compound which is different from the first organic compound; and
    a cathode over and in contact with the electron-injection layer,
    wherein the host material is a π-electron deficient heteroaromatic compound, and
    wherein the electron-injection layer comprises:
        a first layer comprising the second organic compound; and
        a second layer over the first layer, the second layer comprising any one of lithium fluoride, cesium fluoride and calcium fluoride.

2. The light-emitting device according to claim 1, wherein the π-electron deficient heteroaromatic compound has one of a pyridine group, a 2,2'-bipyridine group, and a pyrimidine group to which a carbazolyl group is bonded through a phenylene group or a biphenylene group.

3. The light-emitting device according to claim 1, wherein the anthracene skeleton and the one of the carbazolyl skeleton and the dibenzo[c,g]carbazolyl skeleton are bonded to each other through a para-phenylene group.

4. The light-emitting device according to claim 1, wherein the second layer is in contact with the first layer.

5. The light-emitting device according to claim 1, wherein the host material is represented by any one of the following formulae:

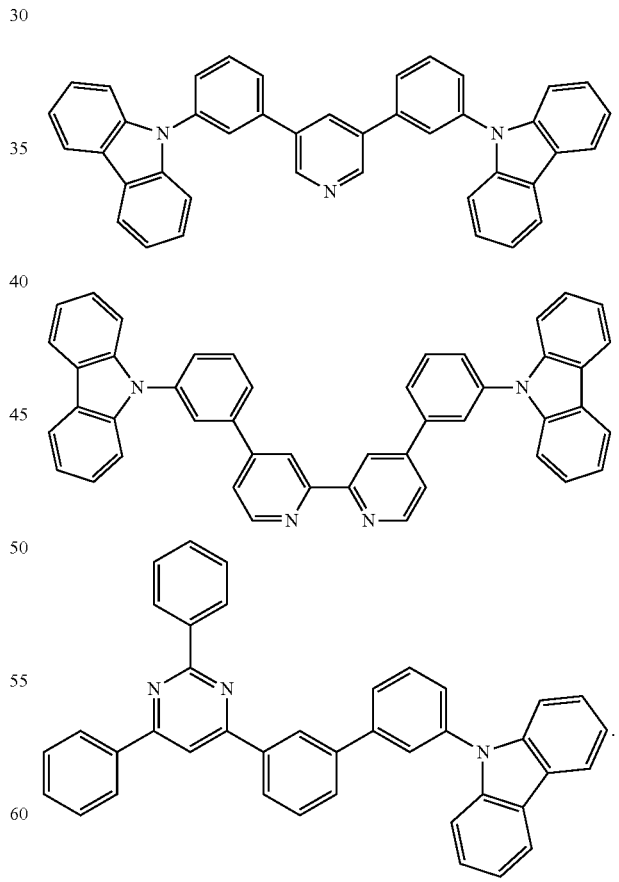

6. The light-emitting device according to claim 1, wherein the first organic compound is represented by any one of the following formulae:

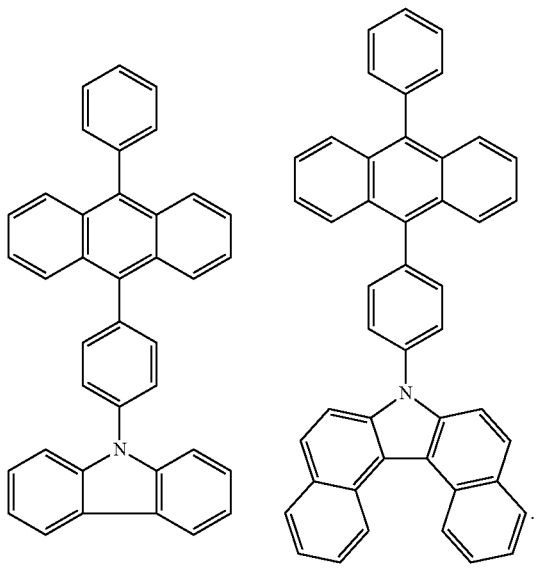

7. A lighting device comprising the light-emitting device according to claim 1.

8. A display device comprising the light-emitting device according to claim 1.

9. An electronic device comprising the light-emitting device according to claim 1.

10. The light-emitting device according to claim 1,
wherein the light-emitting layer comprises a first light-emitting layer and a second light-emitting layer,
wherein the first light-emitting layer comprises the phosphorescent substance, and
wherein the second light-emitting layer comprises the phosphorescent substance and the host material.

11. The light-emitting device according to claim 10, wherein the first light-emitting layer further comprises the host material and a second host material.

12. The light-emitting device according to claim 1,
wherein the host material has an electron transport property higher than a hole-transport property, and
wherein the phosphorescent substance is capable to emit phosphorescence with a peak in a range from 420 nm to 530 nm.

13. A light-emitting device comprising:
an anode;
a light-emitting layer over the anode, the light-emitting layer comprising a host material and a phosphorescent substance;
an electron-transport layer over and in contact with the light-emitting layer, the electron-transport layer comprising a first organic compound which has an anthracene skeleton;
an electron-injection layer over the electron-transport layer, the electron-injection layer comprising:
a first layer comprising a second organic compound; and
a second layer over the first layer, the second layer comprising any one of lithium fluoride, cesium fluoride and calcium fluoride; and
a cathode over the electron-injection layer.

14. The light-emitting device according to claim 13, wherein the electron-injection layer is in contact with the electron-transport layer and the cathode.

15. The light-emitting device according to claim 13, wherein the second organic compound is different from the first organic compound.

16. The light-emitting device according to claim 14, wherein the second layer is in contact with the first layer.

17. A lighting device comprising the light-emitting device according to claim 13.

18. A display device comprising the light-emitting device according to claim 13.

19. An electronic device comprising the light-emitting device according to claim 13.

20. The light-emitting device according to claim 13,
wherein the light-emitting layer comprises a first light-emitting layer and a second light-emitting layer,
wherein the first light-emitting layer comprises the phosphorescent substance, and
wherein the second light-emitting layer comprises the phosphorescent substance and the host material.

21. The light-emitting device according to claim 20, wherein the first light-emitting layer further comprises the host material and a second host material.

22. The light-emitting device according to claim 13,
wherein the host material has an electron transport property higher than a hole-transport property,
wherein the host material is a π-electron deficient heteroaromatic compound, and
wherein the phosphorescent substance is capable to emit phosphorescence with a peak in a range from 420 nm to 530 nm.

* * * * *